United States Patent
Bhoria et al.

(10) Patent No.: US 12,292,839 B2
(45) Date of Patent: May 6, 2025

(54) WRITE MERGING ON STORES WITH DIFFERENT PRIVILEGE LEVELS

(71) Applicant: TEXAS INSTRUMENTS INCORPORATED, Dallas, TX (US)

(72) Inventors: Naveen Bhoria, Plano, TX (US); Timothy David Anderson, University Park, TX (US); Pete Hippleheuser, Murphy, TX (US)

(73) Assignee: Texas Instruments Incorporated, Dallas, TX (US)

( * ) Notice: Subject to any disclaimer, the term of this patent is extended or adjusted under 35 U.S.C. 154(b) by 8 days.

(21) Appl. No.: 18/497,005

(22) Filed: Oct. 30, 2023

(65) Prior Publication Data

US 2024/0078190 A1    Mar. 7, 2024

Related U.S. Application Data

(63) Continuation of application No. 17/842,257, filed on Jun. 16, 2022, now Pat. No. 11,803,486, which is a
(Continued)

(51) Int. Cl.
*G06F 12/128* (2016.01)
*G06F 9/30* (2018.01)
(Continued)

(52) U.S. Cl.
CPC .......... *G06F 12/128* (2013.01); *G06F 9/3001* (2013.01); *G06F 9/30043* (2013.01);
(Continued)

(58) Field of Classification Search
None
See application file for complete search history.

(56) References Cited

U.S. PATENT DOCUMENTS

| 5,651,136 A | 7/1997 | Denton et al. |
| 6,775,750 B2 | 8/2004 | Krueger |
| (Continued) | | |

OTHER PUBLICATIONS

International Search Report for PCT/US2020/034560 mailed Aug. 20, 2020.
(Continued)

*Primary Examiner* — Charles J Choi
(74) *Attorney, Agent, or Firm* — Brian D. Graham; Frank D. Cimino

(57) ABSTRACT

A caching system including a first sub-cache, a second sub-cache, coupled in parallel with the first sub-cache, for storing write-memory commands that are not cached in the first sub-cache, the second sub-cache including privilege bits configured to store an indication that a corresponding cache line of the second sub-cache is associated with a level of privilege, and wherein the second sub-cache is further configured to receive a first write memory command for a memory address associated with a first level of privilege, store, in the second sub-cache, first data associated with the first write memory command and the level of privilege associated with the cache line, receive a second write memory command for the cache line, the second write memory command associated with a second level of privilege, merge the first level of privilege with the second level of privilege, and output the merged privilege level with the cache line.

20 Claims, 14 Drawing Sheets

Related U.S. Application Data continuation of application No. 17/744,810, filed on May 16, 2022, now Pat. No. 11,762,780, which is a continuation of application No. 16/882,387, filed on May 22, 2020, now Pat. No. 11,334,494.

(60) Provisional application No. 62/852,494, filed on May 24, 2019.

(51) Int. Cl.

| | | |
|---|---|---|
| *G06F 9/54* | (2006.01) | |
| *G06F 11/10* | (2006.01) | |
| *G06F 12/02* | (2006.01) | |
| *G06F 12/0802* | (2016.01) | |
| *G06F 12/0804* | (2016.01) | |
| *G06F 12/0806* | (2016.01) | |
| *G06F 12/0811* | (2016.01) | |
| *G06F 12/0815* | (2016.01) | |
| *G06F 12/0817* | (2016.01) | |
| *G06F 12/0853* | (2016.01) | |
| *G06F 12/0855* | (2016.01) | |
| *G06F 12/0864* | (2016.01) | |
| *G06F 12/0884* | (2016.01) | |
| *G06F 12/0888* | (2016.01) | |
| *G06F 12/0891* | (2016.01) | |
| *G06F 12/0895* | (2016.01) | |
| *G06F 12/0897* | (2016.01) | |
| *G06F 12/1027* | (2016.01) | |
| *G06F 12/12* | (2016.01) | |
| *G06F 12/121* | (2016.01) | |
| *G06F 12/126* | (2016.01) | |
| *G06F 12/127* | (2016.01) | |
| *G06F 13/16* | (2006.01) | |
| *G06F 15/80* | (2006.01) | |
| *G11C 5/06* | (2006.01) | |
| *G11C 7/10* | (2006.01) | |
| *G11C 7/22* | (2006.01) | |
| *G11C 29/42* | (2006.01) | |
| *G11C 29/44* | (2006.01) | |

(52) U.S. Cl.
CPC .......... *G06F 9/30047* (2013.01); *G06F 9/546* (2013.01); *G06F 11/1064* (2013.01); *G06F 12/0215* (2013.01); *G06F 12/0238* (2013.01); *G06F 12/0292* (2013.01); *G06F 12/0802* (2013.01); *G06F 12/0804* (2013.01); *G06F 12/0806* (2013.01); *G06F 12/0811* (2013.01); *G06F 12/0815* (2013.01); *G06F 12/082* (2013.01); *G06F 12/0853* (2013.01); *G06F 12/0855* (2013.01); *G06F 12/0864* (2013.01); *G06F 12/0884* (2013.01); *G06F 12/0888* (2013.01); *G06F 12/0891* (2013.01); *G06F 12/0895* (2013.01); *G06F 12/0897* (2013.01); *G06F 12/1027* (2013.01); *G06F 12/12* (2013.01); *G06F 12/121* (2013.01); *G06F 12/126* (2013.01); *G06F 12/127* (2013.01); *G06F 13/1605* (2013.01); *G06F 13/1642* (2013.01); *G06F 13/1673* (2013.01); *G06F 13/1689* (2013.01); *G06F 15/8069* (2013.01); *G11C 5/066* (2013.01); *G11C 7/10* (2013.01); *G11C 7/1015* (2013.01); *G11C 7/106* (2013.01); *G11C 7/1075* (2013.01); *G11C 7/1078* (2013.01); *G11C 7/1087* (2013.01); *G11C 7/222* (2013.01); *G11C 29/42* (2013.01); *G11C 29/44* (2013.01); *G06F 2212/1016* (2013.01); *G06F 2212/1021* (2013.01); *G06F 2212/1024* (2013.01); *G06F 2212/1041* (2013.01); *G06F 2212/1044* (2013.01); *G06F 2212/301* (2013.01); *G06F 2212/454* (2013.01); *G06F 2212/603* (2013.01); *G06F 2212/6032* (2013.04); *G06F 2212/6042* (2013.01); *G06F 2212/608* (2013.01); *G06F 2212/62* (2013.01)

(56) References Cited

U.S. PATENT DOCUMENTS

| | | |
|---|---|---|
| 7,386,685 B2 | 6/2008 | Blumrich et al. |
| 8,095,734 B2 | 1/2012 | Lippert et al. |
| 8,181,005 B2 | 5/2012 | Zuraski, Jr. et al. |
| 8,341,353 B2 | 12/2012 | Venkumahanti et al. |
| 9,170,955 B2 | 10/2015 | Forsyth et al. |
| 2002/0174253 A1 | 11/2002 | Hayter et al. |
| 2003/0200404 A1 | 10/2003 | Wicki et al. |
| 2010/0088472 A1 | 4/2010 | Ukai |
| 2012/0042126 A1 | 2/2012 | Krick et al. |
| 2012/0221774 A1 | 8/2012 | Atkisson et al. |
| 2013/0191601 A1 | 7/2013 | Peterson et al. |
| 2014/0189245 A1 | 7/2014 | Rupley et al. |
| 2015/0006820 A1 | 1/2015 | Bhoria et al. |
| 2017/0177500 A1 | 6/2017 | Shanbhogue et al. |
| 2018/0232311 A1 | 8/2018 | Bhati et al. |

OTHER PUBLICATIONS

International Search Report for PCT/US2020/034557 mailed Sep. 10, 2020.

International Search Report for PCT/US2020/034458 mailed Aug. 27, 2020.

WRITE MERGING ON STORES WITH DIFFERENT PRIVILEGE LEVELS

CROSS-REFERENCE TO RELATED APPLICATION

This application is a continuation of U.S. patent application Ser. No. 17/842,257, filed Jun. 16, 2022, which is a continuation of U.S. patent application Ser. No. 17/744,810, filed May 16, 2022, now U.S. Pat. No. 11,762,780, which is a continuation of U.S. patent application Ser. No. 16/882,387, filed May 22, 2020, now U.S. Pat. No. 11,334,494, which claims priority to U.S. Provisional Application No. 62/852,494, filed May 24, 2019, each of which is incorporated by reference herein in its entirety.

BACKGROUND

In a multi-core coherent system, multiple processor and system components share the same memory resources, such as on-chip and off-chip memories. Memory caches (e.g., caches) typically are an amount of high-speed memory located operationally near (e.g., close to) a processor. A cache is more operationally nearer to a processor based on latency of the cache, that is, one many processor clock cycles for the cache to fulfill a memory request. Generally, cache memory closest to a processor includes a level 1 (L1) cache that is often directly on a die with the processor. Many processors also include a larger level 2 (L2) cache. This L2 cache is generally slower than the L1 cache but may still be on the die with the processor cores. The L2 cache may be a per processor core cache or shared across multiple cores. Often, a larger, slower L3 cache, either on die, as a separate component, or another portion of a system on a chip (SoC) is also available to the processor cores.

Memory systems such as caches can be susceptible to data corruption, for example, due to electronic or magnetic interference from cosmic rays, solar particles, or malicious memory accesses. As processors are increasingly used in critical and/or other fault-intolerant systems, such as self-driving vehicles and autonomous systems, techniques to protect memory systems from data corruption are increasingly being applied to the memory systems. One such technique is the use of error correcting codes (ECC) to detect and correct memory corruption. Implementing ECC in high speed cache memory is challenging as ECC can introduce additional timing overhead that needs to be accounted for. For example, a high speed cache memory system may have a five stage memory pipeline for determining whether a memory address being accessed is in the cache and retrieving the contents of the cache memory. Each stage may take one clock cycle, which at 1 GHz, is about one nanosecond. Error checking the contents of the cache memory can substantially take up a full clock cycle. What is needed are techniques for increasing cache performance for fault tolerant caches.

SUMMARY

This disclosure relates to a caching system. More particularly, but not by way of limitation, aspects of the present disclosure relate to a caching system including a first sub-cache and a second sub-cache in parallel with the first sub-cache, wherein the second sub-cache includes a set of cache lines, line type bits configured to store an indication that a corresponding cache line of the set of cache lines is configured to store write-miss data, and an eviction controller configured to flush stored write-miss data based on the line type bits.

Another aspect of the present disclosure relates to a method for caching data including receiving, by a caching system, a write memory request for a memory address, determining, by a first sub-cache of the caching system, that the memory address is not cached in the first sub-cache, determining, by second sub-cache of the caching system, that the memory address is not cached in the second sub-cache, storing data associated with the write memory request in the second sub-cache, storing, in a line type bit of the second sub-cache, an indication that the stored data corresponds to a write-miss, and flushing the stored data based on the indication.

Another aspect of the present disclosure relates to a device including a first sub-cache, and a second sub-cache in parallel with the first sub-cache; wherein the second sub-cache includes a set of cache lines, line type bits configured store an indication that a corresponding cache line of the set of cache lines is configured to store write-miss data, and an eviction controller configured to flush stored write-miss data based on the line type bits.

Another aspect of the present disclosure relate to a caching system including a first sub-cache and a second sub-cache in parallel with the first sub-cache, wherein the second sub-cache includes: a set of cache lines, line type bits configured to store an indication that a corresponding line of the set of cache lines is configured to store write-miss data, and an eviction controller configured to evict a cache line of the second sub-cache storing write-miss data based on an indication that the cache line has been fully written.

Another aspect of the present disclosure relates to a method for caching data, including receiving, by a caching system, a write memory request for a memory address, determining, by a first sub-cache of the caching system, that the memory address is not cached in the first sub-cache, determining, by second sub-cache of the caching system, that the memory address is not cached in the second sub-cache, storing data associated with the write memory request in the second sub-cache, storing, in a line type bit of the second sub-cache, an indication that the stored data corresponds to a write-miss, and evicting a cache line of the second sub-cache storing the write-miss based on an indication that the cache line has been fully written.

Another aspect of the present disclosure relates to a device including a processor, a first sub-cache, and a second sub-cache in parallel with the first sub-cache, wherein the second sub-cache includes: a set of cache lines, line type bits configured to store an indication that a corresponding line of the set of cache lines is configured to store write-miss data, and an eviction controller configured to evict a cache line of the second sub-cache storing write-miss data based on an indication that the cache line has been fully written.

Another aspect of the present disclosure relates to a caching system including a first sub-cache, and a second sub-cache, coupled in parallel with the first cache, for storing cache data evicted from the first sub-cache and write-memory commands that are not cached in the first sub-cache, and wherein the second sub-cache includes: color tag bits configured to store an indication that a corresponding cache line of the second sub-cache storing write miss data is associated with a color tag, and an eviction controller configured to evict cache lines of the second sub-cache storing write-miss data based on the color tag associated with the cache line.

Another aspect of the present disclosure relates to a method for caching data, including receiving, by a caching system, a write memory command for a memory address, determining, by a first sub-cache of the caching system, that the memory address is not cached in the first sub-cache, determining, by second sub-cache of the caching system, that the memory address is not cached in the second sub-cache, wherein the second sub-cache is configured to store, in parallel with the first sub-cache, cache data evicted from the first sub-cache and write-memory commands that are not cached in the first sub-cache, storing data associated with the write memory command in the second sub-cache, storing, in the second sub-cache, a color tag bit associated with the data, and evicting the stored data based on the color tag bit.

Another aspect of the present disclosure relates to a device including a processor, a first sub-cache, and a second sub-cache, coupled in parallel with the first cache, for storing cache data evicted from the first sub-cache and write-memory commands that are not cached in the first sub-cache, and wherein the second sub-cache includes: color tag bits configured to store an indication that a corresponding cache line of the second sub-cache storing write-miss data is associated with a color tag, and an eviction controller configured to evict the cache line of the second sub-cache storing write-miss data based on the color tag associated with the cache line.

Another aspect of the present disclosure relates to techniques for caching data by a caching system, the caching system including a first sub-cache, and a second sub-cache, coupled in parallel with the first sub-cache, for storing cache data evicted from the first sub-cache and write-memory commands that are not cached in the first sub-cache, the second sub-cache including color tag bits configured to store an indication that a corresponding line of the second sub-cache is associated with a color tag, and an eviction controller configured to evict cache lines of the second sub-cache storing write-memory data based on the color tag associated with the line, and wherein the second sub-cache is further configured to: receive a first write memory command for a memory address, the write memory command associated with a first color tag, store first data associated with the first write memory command in a cache line of the second sub-cache, store the first color tag in the second sub-cache, receive a second write memory command for the cache line, the write memory command associated with a second color tag, merge the second color tag with the first color tag, store the merged color tag, and evict the cache line based on the merged color tag.

Another aspect of the present disclosure relates to a method for caching data, including receiving, by a caching system, a write memory command for a memory address, the write memory command associated with a first color tag, determining, by a first sub-cache of the caching system, that the memory address is not cached in the first sub-cache, determining, by second sub-cache of the caching system, that the memory address is not cached in the second sub-cache, wherein the second sub-cache is configured to store, in parallel with the first sub-cache, cache data evicted from the first sub-cache and write-memory commands that are not cached in the first sub-cache, storing first data associated with the first write memory command in a cache line of the second sub-cache, storing the first color tag in the second sub-cache, receiving a second write memory command for the cache line, the write memory command associated with a second color tag, merging the second color tag with the first color tag, storing the merged color tag, and evicting the cache line based on the merged color tag.

Another aspect of the present disclosure relates to a device including a processor, a first sub-cache, and a second sub-cache, coupled in parallel with the first sub-cache, for storing cache data evicted from the first sub-cache and write-memory commands that are not cached in the first sub-cache, and the second sub-cache including color tag bits configured to store an indication that a corresponding line of the second sub-cache is associated with a color tag, and an eviction controller configured to evict cache lines of the second sub-cache storing write-memory data based on the color tag associated with the line, and wherein the second sub-cache is further configured to receive a first write memory command for a memory address, the write memory command associated with a first color tag, store first data associated with the first write memory command in a cache line of the second sub-cache, store the first color tag in the second sub-cache, receive a second write memory command for the cache line, the write memory command associated with a second color tag, merge the second color tag with the first color tag, store the merged color tag; and evict the cache line based on the merged color tag.

Another aspect of the present disclosure relates to a caching system including a first sub-cache, a second sub-cache coupled in parallel with the first sub-cache, for storing cache data evicted from the first sub-cache and write-memory commands that are not cached in the first sub-cache, the second sub-cache including privilege bits configured to store an indication that a corresponding cache line of the second sub-cache is associated with a level of privilege, and wherein the second sub-cache is further configured to receive a first write memory command for a memory address, the first write memory command associated with a first level of privilege, store, in a cache line of the second sub-cache, first data associated with the first write memory command, store, in the second sub-cache, the level of privilege associated with the cache line, receive a second write memory command for the cache line, the second write memory command associated with a second level of privilege, merge the first level of privilege with the second level of privilege, store the merged privilege level, and output the merged privilege level with the cache line.

Another aspect of the present disclosure relates to a method for caching data, including receiving, by a caching system, a first write memory command for a memory address, the first write memory command associated with a first privilege level, determining, by a first sub-cache of the caching system, that the memory address is not cached in the first sub-cache, determining, by second sub-cache of the caching system, that the memory address is not cached in the second sub-cache, wherein the second sub-cache is configured to store, in parallel with the first sub-cache, cache data evicted from the first sub-cache and write-memory commands that are not cached in the first sub-cache, storing first data associated with the first write memory command in a cache line of the second sub-cache, storing the first privilege level in the second sub-cache, receiving a second write memory command for the cache line, the second write memory command associated with a second level of privilege, merging the first level of privilege with the second level of privilege, storing the merged privilege level, and outputting the merged privilege level with the cache line.

Another aspect of the present disclosure relates to a device including a processor, a first sub-cache, and a second sub-cache, coupled in parallel with the first sub-cache, for storing cache data evicted from the first sub-cache and write-memory commands that are not cached in the first sub-cache, the second sub-cache including privilege bits configured to store an indication that a corresponding cache line of the second sub-cache is associated with a level of privilege, and wherein the second sub-cache is further configured to receive a first write memory command for a memory address, the first write memory command associated with a first level of privilege, store, in a cache line of the second sub-cache, first data associated with the first write memory command, store, in the second sub-cache, the level of privilege associated with the cache line, receive a second write memory command for the cache line, the second write memory command associated with a second level of privilege, merge the first level of privilege with the second level of privilege, store the merged privilege level, and output the merged privilege level with the cache line.

Another aspect of the present disclosure relates to a caching system including a first sub-cache, and a second sub-cache coupled in parallel with the first sub-cache; wherein the second sub-cache includes line type bits configured to store an indication that a corresponding line of the second sub-cache is configured to store write-miss data.

Another aspect of the present disclosure relates to a method for caching data including receiving, by a caching system, a write memory request for a memory address, determining, by a first sub-cache of the caching system, that the memory address is not cached in the first sub-cache, determining, by second sub-cache of the caching system, the second sub-cache coupled in parallel with the first sub-cache, that the memory address is not cached in the second sub-cache, storing data associated with the write memory request in the second sub-cache, and storing, in a line type bit of the second sub-cache, an indication that the stored data corresponds to a write-miss.

Another aspect of the present disclosure relates to a device including a processor, a first sub-cache, and a second sub-cache coupled in parallel with the first sub-cache; wherein the second sub-cache includes line type bits configured to store an indication that a corresponding line of the second sub-cache is configured to store write-miss data.

Another aspect of the present disclosure relates to a caching system including a first sub-cache, a second sub-cache, coupled in parallel with the first sub-cache, for storing cache data evicted from the first sub-cache and write-memory commands that are not cached in the first sub-cache, and a cache controller configured to receive two or more cache commands, determine a conflict exists between the received two or more cache commands, determine a conflict resolution between the received two or more cache commands, and sending the two or more cache commands to the first sub-cache and the second sub-cache.

Another aspect of the present disclosure relates to a method for caching data including receiving two or more cache commands, determining a conflict exists between the two or more cache commands, determining a conflict resolution between the received two or more cache commands, and sending the two or more cache commands to a first sub-cache and a second sub-cache, wherein the second sub-cache is configured to store, in parallel with the first sub-cache, cache data evicted from the first sub-cache and write-memory commands that are not cached in the first sub-cache.

Another aspect of the present disclosure relates to a device including a processor, a first sub-cache, and a second sub-cache, coupled in parallel with the first sub-cache, for storing cache data evicted from the first sub-cache and write-memory commands that are not cached in the first sub-cache, and a cache controller configured to receive two or more cache commands, determine a conflict exists between the received two or more cache commands, determine a conflict resolution between the received two or more cache commands, and sending the two or more cache commands to the first sub-cache and the second sub-cache.

BRIEF DESCRIPTION OF THE DRAWINGS

For a detailed description of various examples, reference will now be made to the accompanying drawings in which.

DETAILED DESCRIPTION

Figure 1:
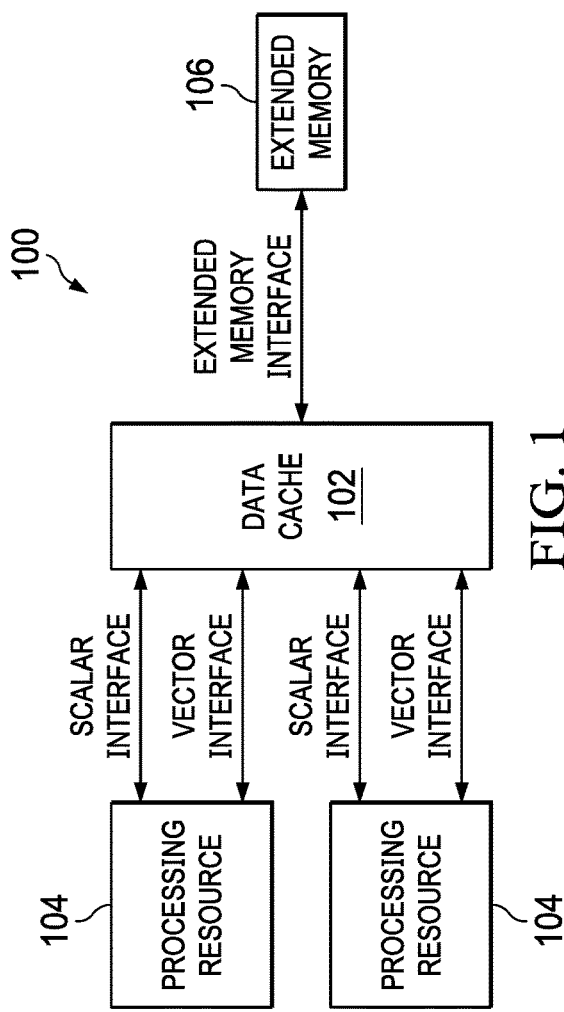
FIG. 1 is a block diagram of a computer system.

FIG. 1 is a block diagram of a computer system 100. The computer system 100 includes a data cache 102, such as a level one (L1) data cache. The data cache 102 stores a subset of the system's data to reduce the time needed to access (e.g., read and/or write) the cached subset. By effectively caching the most commonly used data, the data cache 102 may markedly improve system performance.

The data cache 102 may be coupled to one or more processing resources 104 (e.g., processor cores) and to an extended memory 106. The extended memory 106 includes other levels of a memory hierarchy, such as an L2 cache, storage devices, etc. The data cache 102 may be incorporated into the same die as the processing resource(s) 104 (e.g., on-die cache) or may be on a separate die. In either case, the cache 102 is coupled to each processing resource 104 by one or more interfaces used to exchange data between the cache 102 and the processing resource. In this example, the cache 102 is coupled to each processing resource 104 by a scalar interface and a vector interface. In examples with more than one interface, in the event that one interface is busy, a command may be serviced using another interface. For example, when a scalar read command is received by the cache over the scalar interface, the associated data may be provided to the processing resource 104 over the vector interface based on interface utilization, data size, and/or other considerations. Similarly, the cache 102 may also be coupled to the extended memory 106 by one or more interfaces. Where more than one interface is present, an interface may be selected based on utilization, data size, and/or other considerations.

Each interface may have any suitable width. The widths of the interfaces may be different from each other, although in many examples, they are integer multiplies of the narrowest interface. In one such example, the scalar interface is 64 bits wide, the vector interface is 512 bits wide, and the extended memory interface is 1024 bits wide.

The interfaces may be bidirectional or unidirectional. Bidirectional interfaces may include two independent unidirectional interfaces so that data can be transmitted and received concurrently. In one such example, the vector interface includes two 512-bit unidirectional busses, one for receiving data and operations from the processing resource 104, and one for sending data to the processing resource 104.

Figure 2:
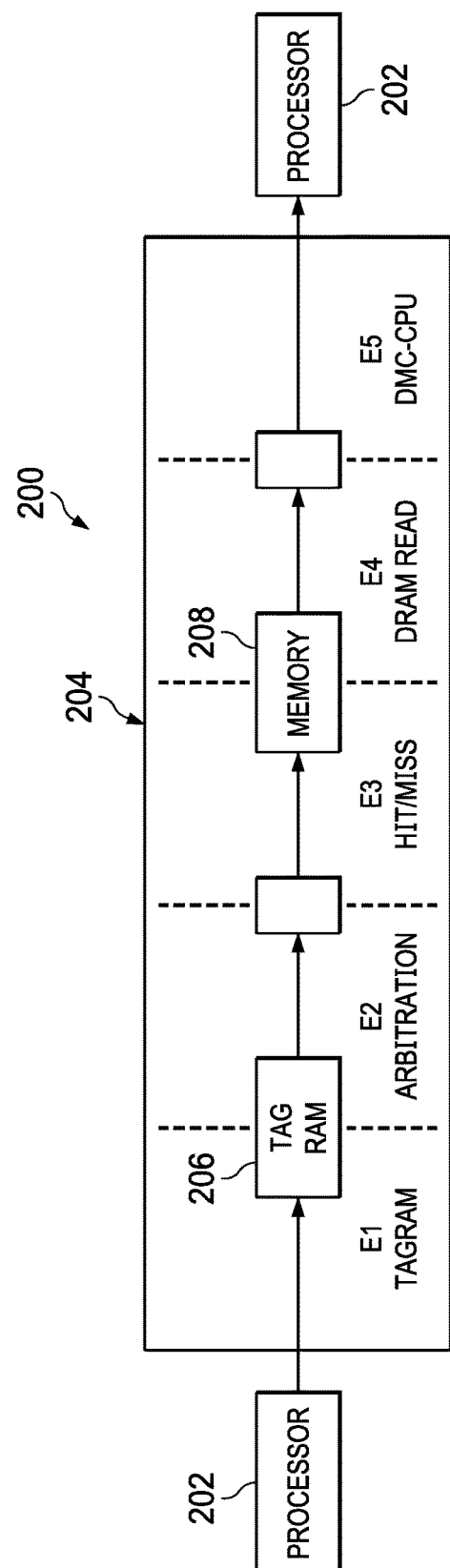
FIG. 2 is a block diagram illustrating a simplified cache memory pipeline for processing a read request.

The data cache 102 may include a number of pipelines for processing operations received via these interfaces. FIG. 2 is a block diagram illustrating a simplified cache memory pipeline 200 for processing a read request. As shown in the cache memory pipeline 200, a processor 202 sends a memory request to a cache memory 204. While the cache memory 204 is described in the context of a L1 cache, the concepts discussed herein may be understood as applicable to any type of cache memory. In certain cases, the memory request may be sent via a cache or memory controller, not shown. In this example, the cache memory pipeline includes five stages, E1, E2, E3, E4, and E5. Each cache memory pipeline stage may be allocated a specific number of clock cycles to complete, and in some examples, each stage is allocated one clock cycle such that cached data may be returned to the processor 202 after the E5 memory pipeline stage in five clock cycles. In the E1 memory pipeline stage, a memory request is received by the cache memory 204. The memory request includes a memory address of the data to be retrieved from. In the E2 pipe stage, a tag random access memory (RAM) 206 is read to determine what memory addresses are currently store in the cache memory. The tag RAM 206 stores a table that records which entries in the memory 208 correspond to which memory addresses in an extended memory. The tag RAM may be a bank or portion of memory used to hold the table of memory addresses. In certain cases, the cache may be a N-way associative cache where each cache set can hold N lines of memory addresses. As N increases, the number of addresses which are searched through also increases, which in turn increases the amount of time needed to determine whether a requested memory address is in the tag RAM. In the E3 memory pipeline stage, the received memory address is compared to memory addresses stored read from the tag RAM to determine whether there is a cache hit or miss. A cache hit occurs when data associated with a requested memory address is stored in the cache and a cache miss occurs when data associated with the requested memory address is not stored in the cache. In the E4 memory pipeline stage, a portion of the memory 208 associated with the requested memory address is read and at the E5 memory pipeline stage, the requested memory address is provided to the processor 202. The memory 208 may be any type of memory suitable for a cache memory, such as dynamic random-access memory (DRAM), static random-access memory (SRAM), registers, etc. It may be understood that the pipeline stages, as described, are for illustrating how a memory pipeline can be configured, and as such, omit certain sub-steps and features. In certain implementations, the stages in which certain activities, such as the memory access, are performed may differ.

Figure 3:
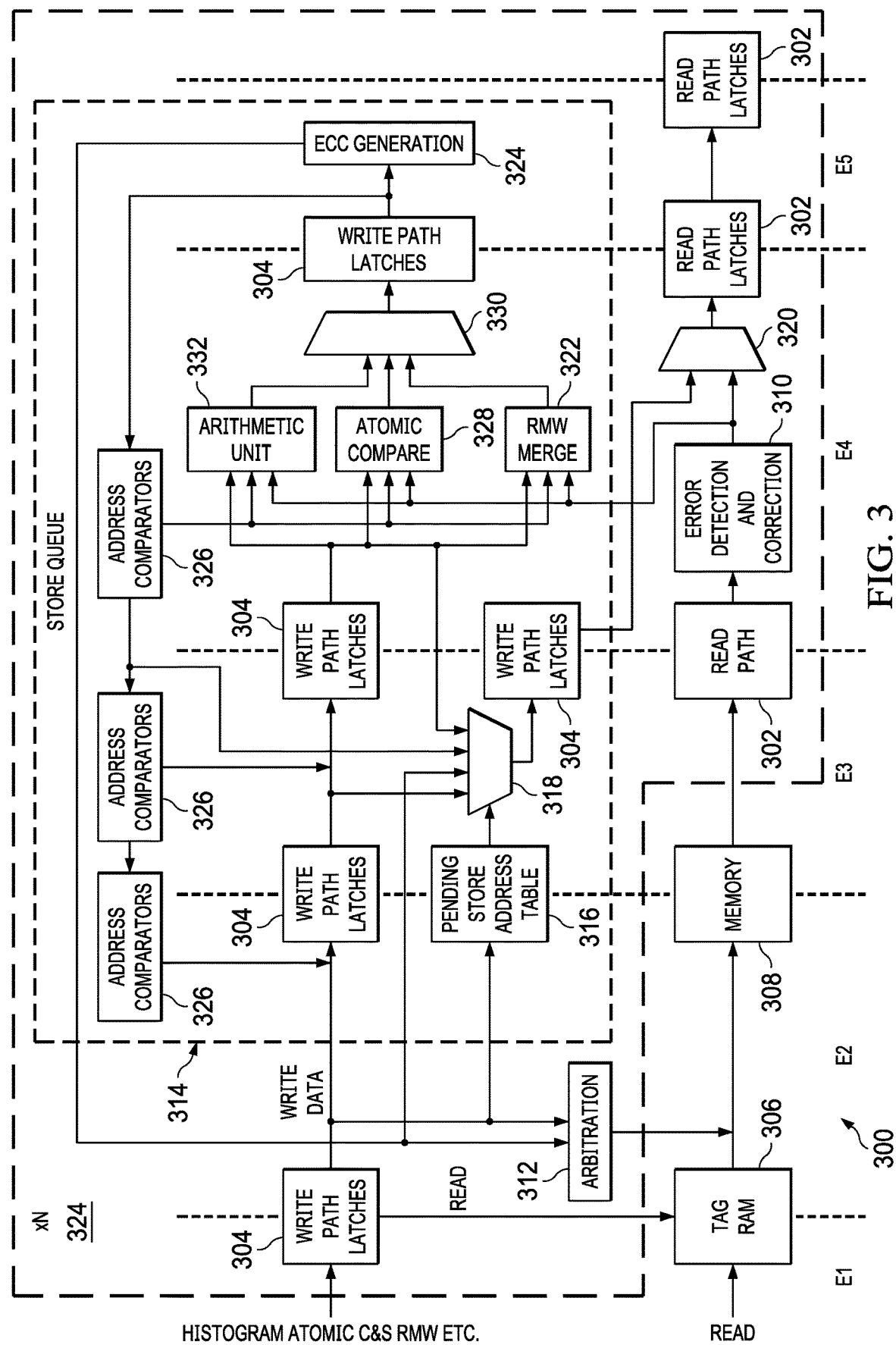
FIG. 3 is a block diagram of a cache memory pipeline with a store queue, in accordance with aspects of the present disclosure.

FIG. 3 is a block diagram illustrating a cache pipeline 300 supporting read-modify-write with error-correcting code store queue architecture, in accordance with aspects of the present disclosure. The pipeline 300 includes a read path (with read path latches 302, tag RAM 306, memory 308, etc.), and write path (write path latches 304, store queue 314, etc.).

With respect to the read path, the pipeline 300 includes a tag RAM 306 and a memory 308 (e.g., DRAM or other suitable memory). The cache may have any degree of associativity, and in an example, the cache is a direct-mapped cache such that each extended memory address corresponds to exactly one entry in the cache memory 308.

In certain cases, the cache pipeline 300 may include support for ECC and the memory 308 may be coupled to an error detection and correction circuit 310. In an ECC example, the memory 308 stores data in blocks along with a set of ECC syndrome bits that correspond to the blocks. When a read operation is received, the memory 308 may provide the stored data block and the corresponding ECC syndrome bits to the error detection and correction circuit 310. The error detection and correction circuit 310 may regenerate the ECC syndrome bits based on the data block as read from the memory 208 and compare the regenerated ECC syndrome bits with those that were previously stored. Any discrepancy may indicate that the data block has been read incorrectly, and the ECC syndrome bits may be used to correct the error in the data block. The ability to detect and correct errors makes the cache well-suited to mission critical applications.

An arbitration unit 312 may be coupled to the memory 308 to arbitrate between conflicting accesses of the memory 308. When multiple operations attempt to access the memory 308 in the same cycle, the arbitration unit 312 may select which operation(s) are permitted to access the memory 308 according to a priority scheme. Many different priority schemes may be used. As an example of a priority scheme, the arbitration prioritizes read operations over write operations because write data that is in the pipeline 300 is available for use by subsequent operations even before it is written to the memory 308, for example via a data forwarding multiplexer 318 of a store queue 314, as will be discussed in more detail below. Thus, there is minimal performance impact in allowing the write data to wait in the pipeline 300. However, as the pipeline 300 fills with write data that has not yet been written back, the priority of the write operations may increase until they are prioritized over competing read operations.

The read path may run in parallel with the store queue 314. Because a read operation may refer to data in a write operation that may not have completed yet, the pipeline 300 may include write forwarding functionality that allows the read path to obtain data from the store queue 314 that has not yet been written back to the memory 308. In an example, the pipeline 300 includes a pending store address table 316 that records the addresses of the operations at each stage of the store queue 314, the data forwarding multiplexer 318 to select data from one of the stages of the store queue 314 for forwarding, and a store queue hit multiplexer 320 that selects between the output of the memory 308 (by way of the error detection and correction circuit 310) and the forwarded store queue 314 data from the data forwarding multiplexer 318.

An example flow of a read operation through the pipeline 300 will now be described. In a first cycle, indicated by stage E1, the cache retrieves a record from the tag RAM 306 that is associated with an address of the read operation to determine whether the data is stored in the cache's memory 308. In a direct mapped example, the cache does not need to wait for the tag RAM comparison before requesting data from the memory 308, and thus, the tag RAM comparison between the address of the read operation and the record of cached addresses does not need to extend into a second (E2) or third (E3) cycle.

In the second cycle, in stage E2, the cache may request the data and ECC syndrome bits from the memory 308, if the arbitration unit 312 permits. In this cycle, the cache may also determine whether newer data is available in the store queue 314 by comparing the read address to the pending store address table 316. If so, the data forwarding multiplexer 318 is set to forward the appropriate data from the store queue 314.

Data and ECC syndrome bits may be provided by the memory 308 in the third cycle in stage E3. However, this data may or may not correspond to the memory address specified by the read operation because the cache may allocate multiple extended memory addresses to the same entry in the cache's memory 308. Accordingly, in the third cycle, the cache determines whether the provided data and ECC from the memory 308 corresponds to the memory address in the read operation (e.g., a cache hit) based on the comparison of the tag RAM record. In the event of a cache hit, the data and ECC bits are received by the error detection and correction circuit 310, which corrects any errors in the data in a fourth cycle in stage E4.

As explained above, newer data that has not yet been written to the memory 308 may be present in the store queue 314, and may be forwarded from the store queue 314 by the data forwarding multiplexer 318. If so, the store queue hit multiplexer 320 selects the forwarded data over the corrected data from the memory 308.

Either the corrected data from the memory 308 or the forwarded data from the store queue 314 is provided to the requesting processor in a fifth cycle in stage E5. In this way, the example cache may provide data to the processor with full ECC checking and correction in the event of a cache hit in about 5 cycles.

In the event that the data and ECC bits are not present in the memory 308 (e.g., a cache miss), the pipeline 300 may stall until the data can be retrieved from the extended memory, at which point the data may be written to the memory 308 and the tag RAM 306 may be updated so that subsequent reads of the data hit in the cache.

The cache may also support a number of operations that read data from the cache and make changes to the data before rewriting it. For example, the cache may support read-modify-write (RMW) operations. A RMW operation reads existing data, modifies at least a portion of the data and overwrites that portion of the data. In ECC embodiments, a RMW operation may be performed when writing less than a full bank width. As the write is not for the full bank width, performing an ECC operation on just the portion of the data being written would result in an incorrect ECC syndrome. Thus, the read functionality of the RWM is used because the portion of the data in the bank that will not be overwritten still contributes to the ECC syndrome bits.

A RMW operation may be split into a write operation and a read operation, and the pipeline 300 may be structured such that the read operation in the read path stays synchronized with the write operation in the store queue 314. The read operation and the write operation remain synchronized until a read-modify-write merge circuit 322 overwrites at least a portion of the read data with the write data to produce merged data. The merged data is provided to an ECC generation circuit 324 that generates new ECC syndrome bits for the merged data, and then the merged data and ECC syndrome bits may be provided to the arbitration unit 312 for storing in the memory 308.

An example flow of a RMW operation through the pipeline 300 will now be described. The read portion of the operation proceeds substantially as explained above in stages E1-E4, where the cache compares an address of the read operation to a record of the tag RAM 306, and the cache requests the data and ECC syndrome bits from the memory 308 and/or the store queue 314. Because the RMW operation will modify the data, in examples that track MESI (Modified, Exclusive, Shared, and Invalid) states of entries in the memory 308, a cache hit that is not in either the Modified or Exclusive state may be considered a cache miss. When the data is obtained in the proper state and any errors are corrected, it is provided to the read-modify-write merge circuit 322 in cycle E4 (or later in the event of a cache miss). In this same cycle, the read-modify-write merge circuit 322 may overwrite at least a portion of the corrected data with the write data to produce merged data. The ECC generation circuit 324 generates new ECC syndrome bits for the merged data in stage E5 (or later in the event of a cache miss). The merged data and the ECC syndrome bits are provided to the arbitration unit 312 for writing to the cache memory 308.

In some examples, sequential RMW operations are received that refer to the same address. Rather than wait for the merged data from the earlier RMW operations to be written to the memory 308, the store queue 314 may include address comparators 326 for write forwarding that may feed the merged data back to a prior stage of the store queue 314 for use by a subsequent RMW operation. This may be referred to as "piggy-backing." The data may be fed back before or after the ECC generation circuit 324. As the feedback effectively merges the RMW operations, the final RMW operation has a complete set of data and ECC syndrome bits. Accordingly, earlier-in-time RMW operations may be canceled before they are written back to the memory 308. This may avoid stalling other operations with writes of obsolete data.

In certain cases, memory 308 may represent the entirety of the data cache. By way of example only, in such an embodiment, the data cache (which may be an L1 data cache) is associated with a single store queue structure 314. As an example, the data cache may include 256 rows, with each row having 1024 bits (1 Kb) per row.

In other examples, the cache may be divided into a plurality of independently addressable banks, and each individual bank may have its own respective store queue structure 314. For instance, consider an embodiment in which the above-mentioned data cache has 256 rows with each row having a line width of 1024 bits, but being divided into 16 banks, with 64 bits per row in a given bank. In such an embodiment, there would be 16 store queues, one for each bank of the data cache. Thus, read and write operations may be sent to the banks in parallel, and each bank arbitrates its own processes in response to the read and/or write operations. By allowing each bank of a multi-bank cache to operate independently, operation of the cache is more efficient since an entire cache line is not locked up when a request is received. Rather, only the portion of the cache line allocated to the bank that received such a request would be locked. Of course, the cache size described above is only one example and the disclosure is not limited to any particular cache line width, number of banks, or rows, etc.

The above example is also useful for writing and/or reading vector data. For instance, vector data may be 512 bits wide. For a multi-bank cache, a write request containing vector data that is a hit in the cache may be processed as 8 parallel writes to 8 banks (e.g., 8×64 bits=512 bits). Similarly, a read request to such a multi-bank cache could be performed as 8 parallel reads from 8 banks.

Another feature that may be present in a contemplated embodiment of the cache system is supporting inflight forwarding and invalidation. For instance, assume in one example that the cache is a two-way set associative cache. In a two-way set associative implementation, each cache line within the cache could map to two different addresses in a higher level of memory (e.g., L2 cache or main system memory for instance).

Consider a situation in which a given cache line, referred to as "Line 1" in this example, is a cache line in a two-way set associate cache and maps to two different addresses in memory, which are referred to as "Address A" and "Address B." Now, suppose that cache receives a first request is received which is a partial write (e.g., a write to less than a full cache line) and is followed by a read request, like so:

Write (Address A): Data 1 //write Data1 to cache line corresponding to Address A
Read (Address B) //read data contained in cache line corresponding to //Address B In this example, let us assume that the Write request is a hit, meaning that the cache line corresponding to Address A, which we will assume is Line 1 in this example, is in the cache. In response, the cache system will begin the process of writing Data 1 to Line 1.

Subsequently, let us assume that the Read request is a miss. In other words, while Line 1 may be mapped to either Address A or Address B in this two-way set associative cache, in this instance it is presently mapped to Address A. The miss thus occurs because Address B is not found in the tag RAM 306. In response to the miss, the cache system will service the miss by going to retrieve the data from a higher level of memory, such as an L2 cache and, when the data, which is referred to as "Data 2" in this example is returned, data currently in Line 1 will be evicted in order to store Data 2. This may occur before the earlier Write has completed. In this case, there is no need to complete the Write operation since the Line 1 is going to be evicted anyways. Thus, the Write can be invalidated prior to its completion, referred to as "inflight."

Atomic operations, such as an atomic compare and swap, are further examples of memory operations that include a read. An atomic compare and swap operation may provide an address, a key value, and a set of new data to be written. The current data at the address is compared to the key, and if they match, the current data at the address is overwritten by the new data. Accordingly, in some examples, the pipeline 300 includes an atomic compare and swap circuit 328 to perform the comparison and forward the new data on for writing if the current data matches the key value. The atomic compare and swap circuit 328 may be coupled in parallel with the read-modify-write merge circuit 322 and a function multiplexer 330 may be used to determine which output is provided to the ECC generation circuit 324.

An example flow of an atomic compare and swap operation through the pipeline 300 will now be described. The read portion of the operation proceeds substantially as explained above in stages E1-E4, where the cache compares an address of the read operation to a record of the tag RAM 306 and the cache requests the data and ECC syndrome bits from the memory 308 and/or the store queue 314. Because the atomic compare and swap operation may modify the data, in examples that track MESI states of entries in the memory 308, a cache hit that is not in either the Modified or Exclusive state may be considered a cache miss. When the data is obtained in the proper state, it is provided to the atomic compare and swap circuit 328 in stage E4 (or later in the event of a cache miss). During these cycles, the new data and the key may be stored in the write path latches 304. During stage E4, the atomic compare and swap circuit 328 may receive the corrected read data, the key, and the new data. If the corrected read data matches the key, the atomic compare and swap circuit 328 provides the new data to the ECC generation circuit 324. The atomic compare and swap circuit 328 may also change the state of the new data to Modified if the read data matches the key. The ECC generation circuit 324 generates new ECC syndrome bits for the new data in stage E5 (or later in the event of a cache miss). The new data and the ECC syndrome bits are provided to the arbitration unit 312 for writing to the cache memory 308.

The pipeline 300 may also perform write forwarding using the address comparators 326 when sequential atomic compare and swap operations are received, similar to that described in the context of the RMW operations.

Further examples of memory operations that read existing data include histogram operations. Histogram operations may specify a value to add to or subtract from existing data. To support histogram operations, the pipeline 300 may include an arithmetic unit 332 coupled in parallel with the read-modify-write merge circuit 322 and/or the atomic compare and swap circuit 328. The arithmetic unit 332 may support any size operands, and in one such example, the arithmetic unit 332 supports addition and subtraction of a 16-bit value from a 64-bit bank. Multiplexer 330 may be used to select between the arithmetic unit 332, the read-modify-write merge circuit 322, and the atomic compare and swap circuit 328.

An example flow of a histogram operation through the pipeline 300 will now be described. The read portion of the operation proceeds substantially as explained above in stages E1-E4, where the cache compares an address of the read operation to a record of the tag RAM 306 and the cache requests the data and ECC syndrome bits from the memory 308 and/or the store queue 314. Because the histogram operation will modify the data, in examples that track MESI states of entries in the memory 308, a cache hit that is not in either the Modified or Exclusive state may be considered a cache miss. When the data is obtained in the proper state, it is provided to the arithmetic unit 332 in stage E4 (or later in the event of a cache miss). During these cycles, the value to be added to the corrected data may be stored in the write path latches 304. During stage E4, the arithmetic unit 332 may receive the corrected read data and the value to be added or subtracted from the read data. The arithmetic unit 332 performs the specified addition or subtraction and provides the new data to the ECC generation circuit 324. The ECC generation circuit 324 generates new ECC syndrome bits for the new data in stage E5 (or later in the event of a cache miss). The new data and the ECC syndrome bits are provided to the arbitration unit 312 for writing to the cache memory 308.

The pipeline 300 may also perform write forwarding using the address comparators 326 when sequential histogram operations are received, similar to that described in the context of the RMW operations.

While FIG. 3 illustrates a single pipeline 300 with a single instance of a store queue 314, latches 302 and 304, an error detection and correction circuit 310, etc. However, as described above, the memory 308 may be arranged to support more than one independent copy of the pipeline 300. Accordingly, the pipeline 300 may be reproduced multiple times. In one such example, the memory 308 entries are 1024-bit blocks based on the width of the extended memory interface, and the memory 308 is arranged into 16 parallel banks where each 1024-bit block includes 64 bits in each of the 16 banks. In this particular example, each of the 16 banks has its own independent pipeline 300. A read or write operation from the processor is divided into a number of bank-level operations and each is provided to its respective pipeline 300 so that they may be processed concurrently. For example, a 512-bit vector read operation may be divided into eight 64-bit read operations that are provided to eight independent pipelines 300 to be processed in parallel. At the same time, another operation may be received over the scalar interface or a vector interface of another processor and divided into operations that are provided to the remaining pipelines 300. Accordingly, the data cache may service multiple independent operations concurrently, with each operation being allocated a subset of the pipelines 300.

In certain cases, the cache pipeline 300 may be coupled to a victim cache. Victim caches may help improve cache miss rates, such as those due to conflict misses. A victim cache, in certain cases, can have an impact on cache performance similar to increasing the N-way associative number (e.g., a degree of cache associativity). This benefit may be more evident in cases where the victim cache is added to a direct-mapped cache, as a direct mapped cache typically has the highest rate of conflict misses. The addition of a victim cache may help improve an overall cache hit rate.

Figure 4:
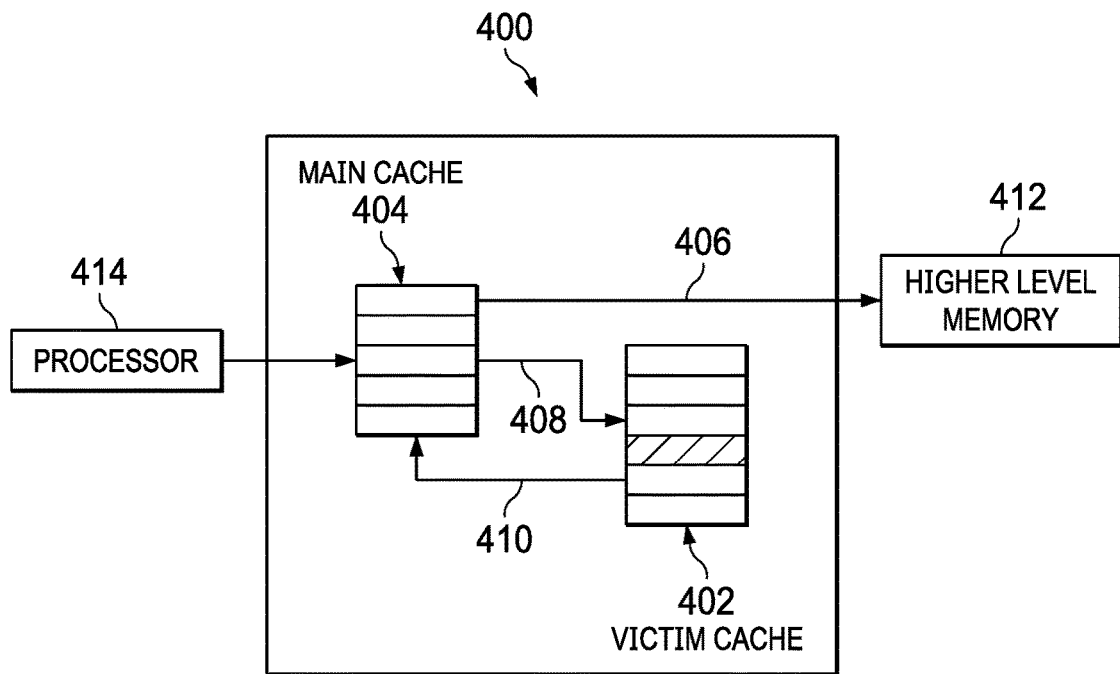
FIG. 4 is a block diagram illustrating a cache architecture including a victim cache.

FIG. 4 is a block diagram illustrating a cache architecture 400 including a victim cache. Here, the cache architecture 400 includes a main cache 404 coupled to a victim cache 402, where the victim cache 402 resides after the main cache 404. When a line of data is evicted out of the main cache 404, rather than moving the line of data to a next level cache (e.g., L2), the line of data is moved to the victim cache 402 and held there until there is a reason to evict it out, such as due to capacity or other reasons. In such a cache architecture 400, in case of a cache miss from the main cache 404, the victim cache 402 can service the miss and return the line to the processor 414, reducing the overall latency experienced for a read miss.

As an example, suppose a processor 414 attempts to access address A in the main cache 404 and the victim cache 402, causing a cache miss. The main cache 404 may then evict address B from the main cache 404 and create a victim cache (Address B) line in the victim cache 402. The read miss of address A then goes out 406 to a higher level memory 412, such as L2 cache, another cache, and/or other memory, to be serviced. Once address A is accessed, the contents of address A may be returned 410 and stored in the main cache 404.

If a subsequent access attempt for address B is issued, the main cache 404 is checked to see if address B is cached, resulting in a cache miss. The victim cache 402 is then checked 408, which returns a hit as address B was stored in the victim cache 402 after being evicted from the main cache 404. Address B may then be restored 410 to the main cache 404 and returned as a result to the processor 414. The read latency in such a system, while faster as compared to having to fetch the address from higher level memory 414 (e.g., L2 cache, main memory, etc.), is still greater than the latency when there is a cache hit in the main cache 404.

Figure 5:
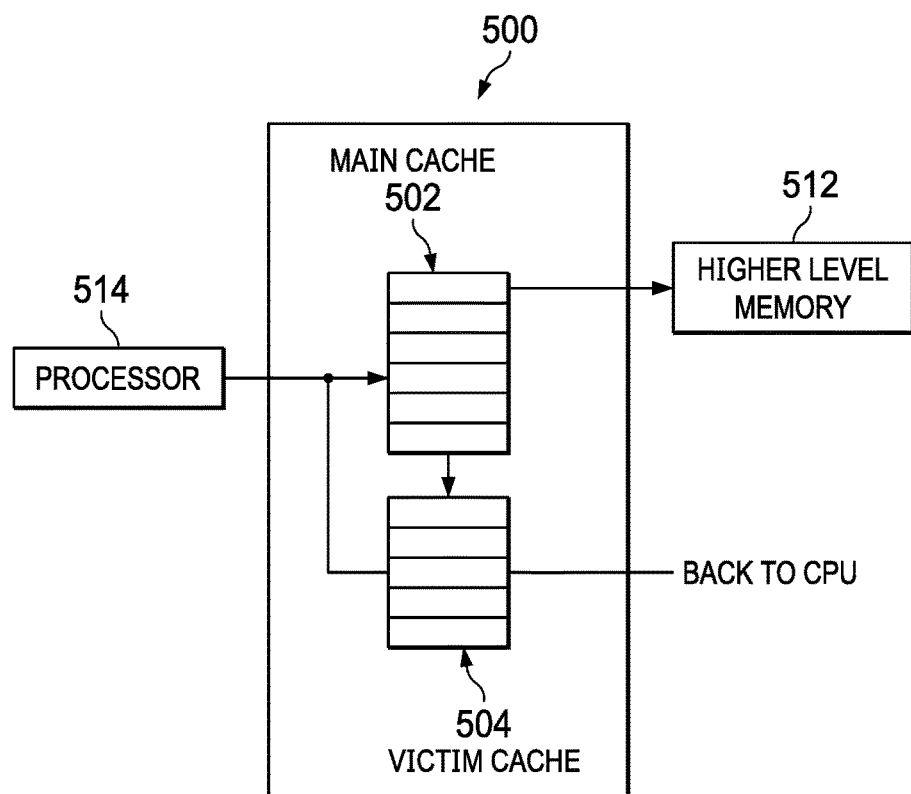
FIG. 5 is a block diagram illustrating a cache architecture including a parallel victim cache, in accordance with aspects of the present disclosure.

To help address the latency experienced in cache architectures which place the victim cache after the main cache, in certain cases, the victim cache may be placed in parallel with the main cache. FIG. 5 is a block diagram illustrating a cache architecture 500 including a parallel victim cache, in accordance with aspects of the present disclosure. The cache architecture 500 can be thought of as having multiple sub-caches in parallel. Each of the main cache 504 and the victim cache 502 has their own independent associativity and the overall cache system 500 may have the appearance of a hybrid way cache system. In certain cases, either the main cache 504 or the victim cache 502 may be n-way associative, while the other cache may be fully associative. In this example, the main cache 504 may be a direct mapped (1-way associative) cache and the victim cache 502 may be fully associative.

In this example, if a processor 514 issues a read to address A, which misses in the main cache 504, the miss request goes out to a higher level cache 512 for servicing and the victim line, here address B, is moved to the victim cache 502. Next, let us assume the processor 514 wants to read address B. In this example, the address of the read is checked against both the main cache 504 and the victim cache 502 in parallel. This results in a read miss in the main cache 504 but a hit in the victim cache 502. The read results for address B may then be directly returned from the victim cache 402 to the processor 514. As both caches are checked in parallel, the read latency remains the same as if the read request was a hit in the main cache 504. The overall effect of having a victim cache in parallel to the main cache is that we get the benefit of reducing the cache miss rate while also not impacting the latency in case the subsequent CPU access hits the victim cache.

Figure 6:
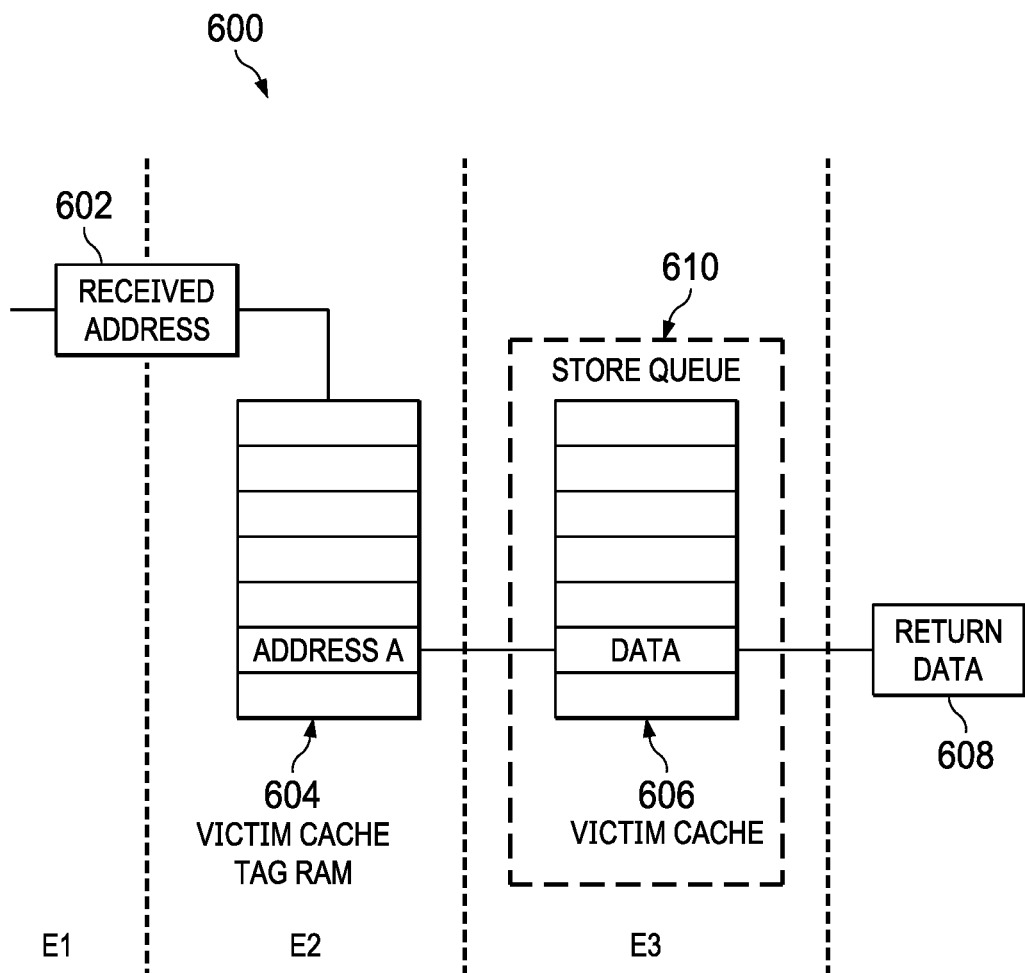
FIG. 6 is a block diagram illustrating a victim cache memory pipeline, in accordance with aspects of the present disclosure.

FIG. 6 is a block diagram illustrating a victim cache memory pipeline 600, in accordance with aspects of the present disclosure. As discussed above, the victim cache may be a fully associative cache, meaning that there is not a mapping addresses and cache lines. Rather any address may be stored in any cache line of the victim cache. Thus, for an address received at block 602 in the E1 stage, the received address is checked, in the E2 stage, against addresses stored in each location in the victim cache tag RAM 604. In certain cases, these locations in the victim cache tag RAM 604 correspond to lines of the victim cache 606. For example, if address A is received at block 602, address A is compared against addresses in the victim cache tag RAM 604 to see if there is a match. If, for example, location 5 of the victim cache tag RAM 604 corresponds to address A, then the data corresponding to address A is stored in address 5 of the victim cache 606. This data is eventually returned to the processor at block 608.

Where the victim cache operates in parallel to the main cache, it may be desirable for the victim cache to support certain features of the main cache, such as ECC and RMW operations. In certain cases, the victim cache may also include a store queue 610 structure to help provide support for RMW and ECC operations, in a manner similar to the store queue 314 as discussed in conjunction with FIG. 3.

In certain cases, caches may include a write-miss buffer. A write-miss can occur when a memory write is issued to a cache against a memory address that is not in the cache. The memory write may be an atomic operation, the processor that issued the memory write may stall until a memory write complete message is returned to the processor. Rather than stalling the processor until a write to a higher level memory is complete, the cache may store the memory write in a write-miss buffer and returns an indication that the memory write is complete. The write-miss buffer this information and then outputs (e.g., drains) the memory write to the target memory address. Once the memory write output to the target memory address is complete, the memory write is removed from the write-miss buffer. To output the memory write, the write-miss buffer may include three pieces of information for each memory write: the memory address for the write, the corresponding data, and the byte enable (byten) mask for the memory write. Generally, the byte enable logic or mask that defines a portion of the memory line to be written to. Typically, write-miss buffers are implemented using dedicated buffer circuitry as a first in first out (FIFO) buffer. However, FIFO write-miss buffers are typically configured to drain to a higher level memory more or less continuously and do not support features such as write merging. In certain cases, a write-miss buffer may be allocated into the cache system using the victim cache.

Figure 7:
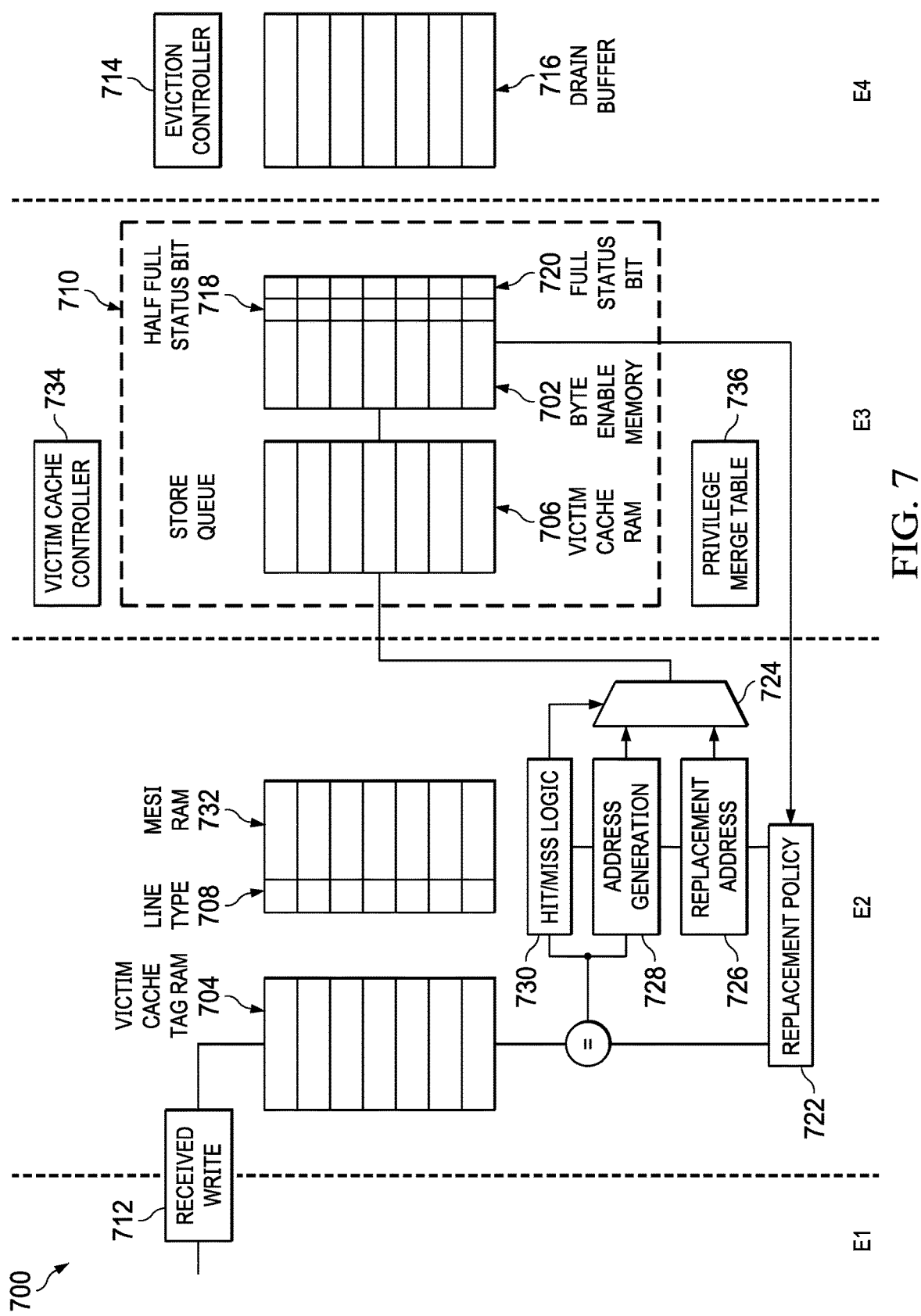
FIG. 7 is a block diagram illustrating a victim cache pipeline including a write-miss buffer, in accordance with aspects of the present disclosure.

FIG. 7 is a block diagram illustrating a victim cache pipeline 700 including a write-miss buffer, in accordance with aspects of the present disclosure. As discussed above, a write-miss buffer may store the memory address for the write, the data to be written, and the byten logic. In this example victim cache pipeline 700 the memory addresses for a write-miss buffer entry may be stored in a victim cache tag RAM 704 and the corresponding data may be stored in the victim cache RAM 706. A byte enable memory 702 may also be added to the victim cache to store the byten logic associated with a write-miss buffer line. In certain cases, the MESI RAM 732 may be modified to include an extra bit indicating a line type 708 associated with an entry in the victim cache RAM 706. The line type 708 indicates whether a particular line of the victim cache RAM 706 is a cache line or a write-miss buffer line. In certain cases, the line type 708 may be added to another memory, such as the victim cache tag RAM 704, rather than the MESI RAM 718.

Additionally, the victim cache system, for example as discussed in conjunction with FIG. 6, may be configured as a write-miss buffer by adding control logic in read and write-miss state machines to address allocating of write-miss entries inside the victim cache, as well as logic to support handling various address hazards in cases like a read to the same line as a write-miss entry inside the victim cache (selective write-miss flush), and logic to support resolving same address load/stores in data-paths of the victim cache. A storage queue 710 structure may also be provided to enable support for RMW and ECC support for write-misses. In certain cases, the storage queue 710 may be used to enable support for RMW and ECC support for write miss operations as well as cache operations.

As an example of performing write-miss buffer operations in a cache, when a write is received at block 712, the address of the write is checked against memory addresses stored in each location in the victim cache tag RAM 704. A write-miss occurs when the address of the write is not found in the victim cache tag RAM 704. When operating as a write-miss cache, a determination is made where to store the write-miss in the victim cache. In certain cases, this determination may be made based on entries in the victim cache tag RAM 704. If there is an empty location in the victim cache tag RAM 704, then the address of the write-miss is stored in the victim cache tag RAM 704 in the empty location. If there is not an empty location, then a line may be evicted based on an eviction scheme for allocating the write-miss buffer space. In other cases, the line may have previously been used as a write miss buffer or a cache line. The line type 708 corresponding to the location in the victim cache tag RAM 704 of the write-miss may be updated to indicate that the location is being used as a write-miss buffer. For example, a 0 in the line type 708 may indicate the corresponding line is a cache entry, while a 1 in the line type 708 may indicate that the corresponding line is a write-miss buffer entry. In certain cases, the line type 708 may be store in another memory location, such as the MESI RAM 732, or in a dedicated memory space, such as a set of registers. The data of the write-miss is stored in a line of the victim cache RAM 706 corresponding to the victim cache tag RAM 704 location used. The byte enable logic may be stored in a corresponding slot of the byte enable memory 702. In certain cases, the byte enable memory 702 may include bits indicating which positions of the byte enable memory 702 are valid. The line type bit helps enable storing write miss entries in lines of the victim cache RAM 706 without having to dedicate a portion of the victim cache RAM 706 as a write buffer.

According to aspects of the present disclosure, the victim cache eviction logic, for example in an eviction controller 714, may be updated to handle write-miss entries stored in the victim cache to prioritize evicting write-miss entries in favor of store cache entries. Additionally, control logic for read and write state machines of the victim cache controller 734 may be configured to determine that an incoming read request might hit a cache line of the victim cache configured to store a write-miss. In such cases, the victim cache controller 734 may be configured to treat this read hit like a read-miss and evict the stored write miss command to higher level memory and then send the read miss out to the higher level memory. Additionally, cache system are typically configured to stall on a miss while a write-miss buffer typically does not stall a processor as it buffers the write miss. To help address this difference, the victim cache controller 734 may be configured to allocate write miss entries to the victim cache without stalling the CPU by speculatively reading an incoming write data so that data can be stored directly in to the victim cache without stalling if it is a write miss.

In certain cases, by placing write-misses in a cache system, the write-misses may stay cached until there is a requirement to evict them out to higher level memories. In certain cases, a write-miss stored in the victim cache may stay in the cache system until a defined condition is met, a fence operation is requested, or there are address/hardware conflicts which need a particular write-miss entry to be evicted.

Maintaining the write-miss buffer until an explicit fence operation is requested may be problematic, for example, if a fence operation is not raised at the end of an operation, and any write-misses stored in the victim cache may be stuck inside the victim cache. Additionally, there can be latency concerns from fence operations, as flushing out (e.g., evicting all) write miss buffers stores only in response of a fence operation can result in delays as the cache needs to drain the stored write-misses out to the appropriate memories and then wait for the acknowledgments to return. In certain cases, an auto-flushing or draining of write-miss entries stored in the victim cache may be provided. Auto-flushing may be implemented to help drain write-miss entries from the victim cache while reducing the potential latency that may be incurred in the drain process. In certain cases, an eviction controller 714 may monitor activity on a processor interface. If the eviction controller 714 detects idle activity on the processor interface, the eviction controller 714 may proceed to start draining write-miss entries from the victim cache. For example, if the eviction controller 714 detects that the processor has not issued any commands for N number of clock cycles, then the eviction controller 714 may internally start an auto-flush process to start draining the stores cached inside victim cache. In certain cases, N may be predetermined. In other cases, N may be configurable. In certain cases, the auto-flush process may walk (e.g., examine in order) the VTag RAM looking for write-miss entries and flushing entries corresponding to write-miss entries. In other cases, the auto-flush process may include logic to flush entries based in a FIFO, least recently used (LRU), random, or other basis.

In auto-flushing write-miss entries, the eviction controller 714 may send an eviction trigger request to the victim cache controller 734 for a selected write buffer cache line. The victim cache controller 734 checks the store queue to see if there are any entries in the store queue corresponding to a write buffer cache line to be flushed. If there is a corresponding entry in the store queue, then the victim cache controller 734 may wait for the store queue to complete. Once the store queue is emptied, the victim cache controller 734 may evict the selected cache lines. The victim cache controller 734 sets up the creation of store miss packets to be sent to higher level caches or other memories. These store miss packets may include the corresponding memory address stored in the victim cache tag RAM 704, byte enable logic in the byte enable memory 702, and the data in the victim cache RAM 706. The victim cache can then send the store miss packet, for example to a cache controller of a higher level cache or other memory. When flushing write-miss entries, the write miss packet may be sent out to other memories and the corresponding entries in the victim cache RAM 706, victim cache tag RAM 704, and byte enable memory 702 may be invalidated. The write miss packet may be placed in a drain buffer 716 temporarily until the write miss packet is accepted (e.g., acknowledged) by the other memory. Once the write miss buffer cache line is invalidated, the eviction controller 714 may select a next write miss buffer cache line to evict and proceed to evict the next write miss buffer cache line. If activity is subsequently detected on the processor interface, this auto-flush operation may be cancelled. By doing so, the victim cache is able to utilize idle periods and avoid impacting processor performance when there is activity on the interface by attempting to drain the write-miss buffer entries.

In certain cases, write-misses stored in the victim cache may be evicted based on a state of the write miss line storing a particular write-miss, rather than a FIFO, LRU, random, or other scheme based on the order which a cache line is allocated. Where the cache is configured to merge data in the cache, cache writes to a memory line from a processor do not imply that the processor needs to read from other portions of the memory line. Further, where a processor has written out a large portion of the memory line, such as half the memory line or the whole memory line, the processor is less likely to need to access (such as merging additional data into) that portion of the memory line again, as compared to where the processor has written only a small portion of the memory line. As the processor is less likely to need to access a given write miss cache line after writing out a half or the full write miss cache line, this write miss cache line can be evicted with less potential impact to performance. Thus, once a write miss cache line is fully written to, or half written to, and a write has started on a next entry in the victim cache on another write miss cache line, the full, or half full, cache line may be evicted. This helps address the case where a processor is issuing a stream of cache writes-misses which are collectively larger than the victim cache. Additionally, aggressively evicting full or half full write-miss cache lines helps avoid performance issues that may arise when a large number of write-miss items stored in the victim cache are all flushed at once due to a fence operation at the end of an operation.

To help support removing full or half full write-miss cache lines, the byte enable memory 702 may include two status bits, a half-full line status bit 718 and a full line status bit 720. Each line of the byte enable memory 702 corresponds with a cache line in the victim cache ram 206 and each line of the byte enable memory 702 may include the half-full line status bit 718 and the full line status bit 720. These status bits may be updated each write cycle where bits are written into a cache line configured as a write miss buffer and the status bits may be calculated based on the bits already stored in the corresponding line of the victim cache RAM 706, as well as the bits that are being written to the victim cache RAM 706 in a write cycle. In certain cases, this updating may be performed for each cache line of the byte enable memory 702 for each cycle and updating may be omitted when there is not a write cycle. As indicated above, each line of the byte enable memory 702 can include a bit mask indicating which positions (e.g., bytes) of the byte enable memory 702 are valid (e.g., written to). Determining which lines are full or half full can be performed using an XOR over corresponding portions of the bit mask. The half-full line status bit 718 may be set when half of a given cache line has been written to, either the least significant bits, or the most significant bits. Similarly, the full line status bit 720 may be set when an entire cache line has been written to. The cache lines may then be walked (e.g., examined in order) to determine an address to return that has a full or half full cache line. In certain cases, addresses corresponding to full cache lines are selected first and addresses corresponding with half full cache lines are returned if there are no full cache lines. If multiple cache lines are full (or half full, if there are no full cache lines), then the first cache line that is full (or half full) found when walking the cache lines may be selected. If no cache line is full or half full, a write-miss cache line may be selected based on FIFO, LRU, or other logic may be used to determine which cache line to select where there are multiple lines available.

Evicting write-miss entries may operate similarly to auto-flush except that the store queue is not checked to see if there are any entries corresponding to a full or half full write miss cache line being evicted as this operation is initiated by a read or write miss and is performed after a line has been written to. Once a full or half full write miss cache line has been selected for eviction, the eviction controller 714 indicates to a victim cache controller 734 to evict the selected cache lines. The victim cache controller 734 sets up the creation of store miss packets to be sent to higher level caches or other memories. These store miss packets may include the corresponding memory address stored in the victim cache tag RAM 704, byte enable logic in the byte enable memory 702, and the data in the victim cache RAM 706. The store miss packets are sent, for example to a cache controller of a higher level cache or other memory and the corresponding entries in the victim cache RAM 706, victim cache tag RAM 704, and byte enable memory 702 may be invalidated. The store miss packet may be placed in a drain buffer 716 temporarily until the store miss packet is accepted (e.g., acknowledged) by the other memory.

Once the write-miss cache lines have been invalidated, the address of the cache line may be sent to replacement policy logic 722 each write cycle. Cache line address which are available may be fed into mux 724 in a replacement address line 726. An address generation line 728 may include an address assigned to a received write instruction. If hit/miss logic 730 determines that the address of the received write instruction is a hit, the address is already stored in a line of the victim cache and data from the write instruction is merged to the line. If hit/miss logic 730 determines that the address of the received write instruction is a miss, an address from the replacement address line 728 may be used to write the write-miss command to the victim cache/write miss buffer. An eviction process may be triggered if there are no empty cache lines in the victim cache/write miss buffer to allocate the write miss. In an eviction process, a centralized controller may detect that a write miss has been received that needs to be stored into the victim cache. The centralized controller may instruct the victim cache controller 734 to ensure that there is a cache line available. This cache line may be based on a location provided by either the replacement address 726, or the address generation 728. If there is already a write miss stored in the identified location, the write miss may be evicted.

Figure 8:
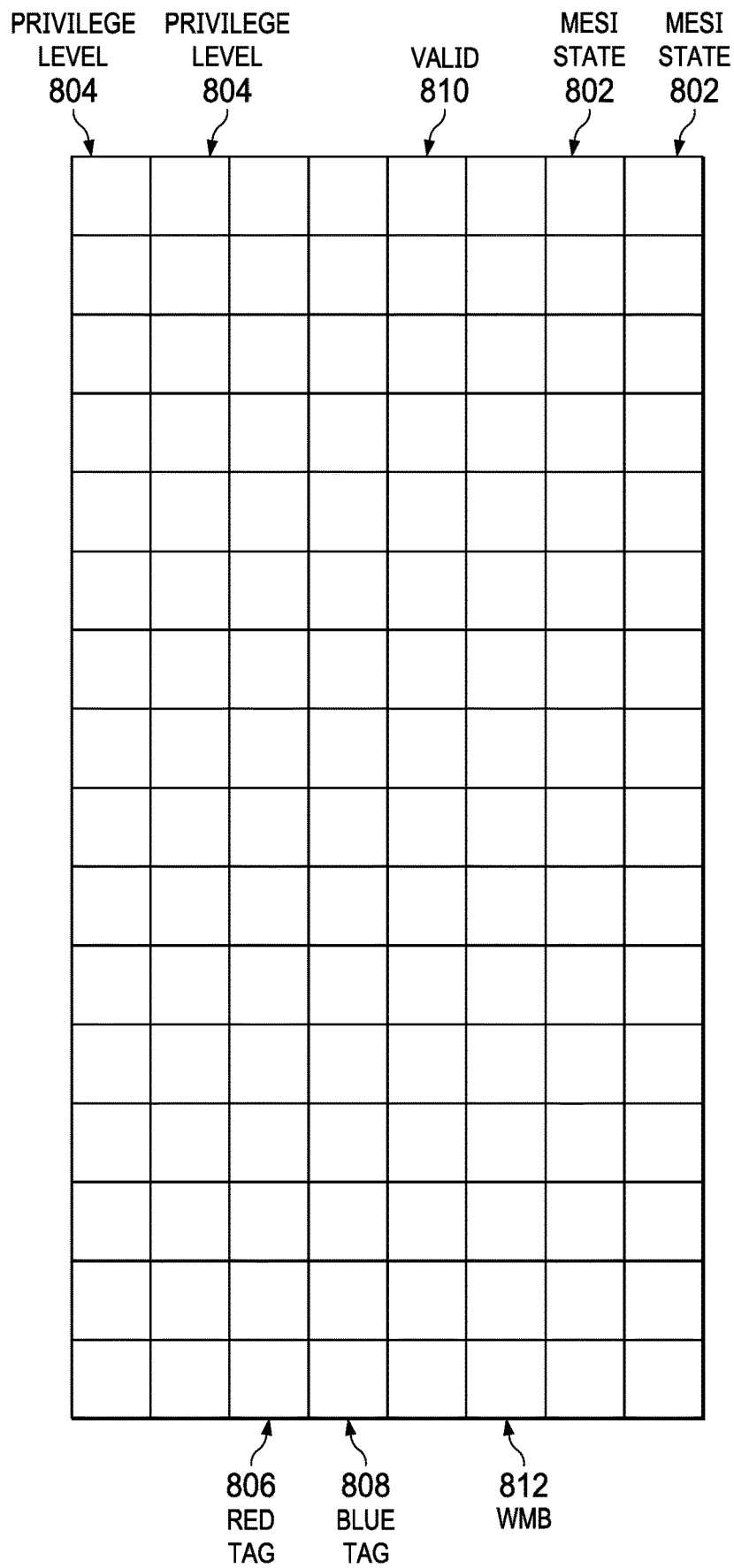
FIG. 8 is a block diagram of a MESI RAM, in accordance with aspects of the present disclosure.

FIG. 8 is a block diagram of a MESI RAM 800, in accordance with aspects of the present disclosure. The MESI RAM 800 may be a memory (e.g., SRAM) or set of registers (e.g., register file), used to track the MESI status of a corresponding cache line. As an example, the victim cache, in certain cases, may track MESI states in MESI state bits 802 in the MESI RAM 800 for cache entries as a part of writing data. In certain cases, the MESI RAM 800 includes a line corresponding to each line of the corresponding cache, here, the victim cache. It may be understood that the main cache may include a corresponding MESI RAM. In certain cases, a single MESI RAM may be shared by both a main and victim cache. The MESI RAM 800 may have a set of bits for tracking the MESI state of each cache line stored in the victim cache. In certain cases, the MESI RAM 800 may be expanded with additional bits to track other states of cache lines in the victim cache. The MESI RAM 800 may be expanded to track additional states by including additional columns for the additional states. In this example, the MESI RAM has been expanded to include state bits in a bit field to track a privilege level 804 for each cache line, a red tag 806, a blue tag 808, whether a line is valid 810, and whether a line is a write miss buffer or victim cache line 812. It may be noted that while shown as a part of the MESI RAM, the state bits may be placed within other memories in other embodiments, such as the tag RAM 704, or in a separate memory altogether. It may be understood that the MESI RAM may be configured to track additional states not shown here.

In certain cases, it may be useful to flush all write-miss buffer entries of a certain type stored in the victim cache. As discussed below, entries in the write-miss buffer may be associated with a "color" tag. This color tag may be represented by one or more bits such that when a bit is set for a write-miss buffer entry, the color associated with the write-miss buffer entry may be "blue" and when the bit is not set, or another bit is set, the write-miss buffer entry may be "red." Tagging helps allow certain write-miss buffer entries to be associated with a particular process running on a processor, while other write-miss buffer entries may be associated with another process running on the processor. In certain cases, a processor may want to flush all write-miss buffer entries associated with a particular process (e.g., a selective fence operation), but not the write-miss buffer entries associated with another process.

To perform a selective fence operation, a processor may assert a drain signal. Along with the asserted drain signal, the processor may provide an indication that a particular tag should be prioritized for draining, either the red or blue tag. Referring back to FIG. 7, the drain signal is passed to the eviction controller 714. The eviction controller 714 may check an availability of a higher level cache or memory to see whether the higher level cache or memory is busy. If the higher level cache or memory is unavailable, the eviction controller 714 may stall the processor. If the higher level cache or memory is available, then the eviction controller 714 may send an eviction trigger request indicating the prioritized tag to the victim cache controller 734. The victim cache controller 734 may then check with the store queue to see if there are any outstanding entries in the store queue for any bank of the victim cache RAM 706. The victim cache controller 734 may also indicate to the store queue 710 to escalate the priority of draining the store queue. If there is data, for example in the store queue, that has not yet been stored to the victim cache, the eviction controller 714 may wait for the store queue 710 to complete. Once the store queue 710 is emptied, the eviction controller 714 indicates to a victim cache controller to evict the selected cache lines. The victim cache controller 734 sets up the creation of store miss packets to be sent to higher level caches or other memories. These store miss packets may include the corresponding memory address stored in the victim cache tag RAM 704, byte enable logic in the byte enable memory 702, and the data in the victim cache RAM 706. The victim cache can then send the store miss packet, for example to a cache controller of a higher level cache or other memory. When flushing write-miss entries, the write miss packet may be sent out to other memories and the corresponding entries in the victim cache RAM 706, victim cache tag RAM 704, and byte enable memory 702 may be invalidated. The write miss packet may be placed in a drain buffer 716 temporarily until the write miss packet is accepted (e.g., acknowledged) by the other memory. This flushing continues until the processor ceases to assert the drain signal. If the processor stops asserting the drain signal before all write-miss buffer entries of the indicated color have been drained, draining of the write-miss buffer stops wherever in the draining process the victim cache is in when the drain signal stops being asserted. Once all write miss buffer entries of the indicated color tag have been drained, an idle signal is asserted back to the processor. If the processor continues to assert the drain signal, other write miss buffer entries associated with the other color tag may be drained.

Placing write-misses in a cache system helps provide an opportunity to merge additional write misses to the write miss already in the cache system. As write-misses can stay longer inside the cache, the cache has an opportunity to merge any future write-misses to write-misses already existing in the cache system, thus reducing the write-miss traffic out to higher level memories. Reducing the write-misses being sent to higher level memories can reduce the pressure on those memories and help improve overall performance.

A write merge may occur when a processor issues a second store or write command to a particular address at block 712. Where the victim cache is fully associative, the address of the second write may be checked, by the hit/miss logic 730, against a set of memory addresses stored in each location in the victim cache tag RAM 704. In parallel, a replacement policy 722 logic determines a location inside of the victim cache where the write transaction could be allocated in case of a write miss. Generally, when a write miss is stored in the victim cache, the write miss is allocated an entire cache line, even if the data in the write miss does not need an entire cache line. Thus, a set of memory addresses may be associated with each write miss stored in the victim cache, including the memory address in the write miss, along with a set of memory addresses either before, after, or both before and after the memory address in the write miss. If the address of the second write is determined to be within a set of memory addresses associated with a write-miss stored in the victim cache, then a cache hit is detected and the hit/miss logic returns the location in the victim cache where the write-miss is currently stored. In the E3 pipestage, the color type and privilege level associated with the second write is merged, for example by the victim cache controller 734, with the currently stored color type and privilege level and the MESI RAM 732 is updated. In certain cases, merging the privilege level may be performed with reference to a privilege merge table 736. The data of the second write is also merged into the corresponding line of the victim cache RAM 706 and the corresponding entry of the byte enable memory 702 updated based on the byte enable logic associated with the second write, for example by the victim cache controller 734. In certain cases, the store queue 710 may also include write merge functionality. For example, when back to back writes are issued to the same address, the store queue 710 may internally merge them to help minimize a number of writes to issue to the victim cache RAM 706.

In certain cases, write merging may be performed across privilege levels. Merging the privilege level may be performed when performing write merging. For example, a first write-miss stored in the victim cache may be associated with a first privilege level. A second write associated with a second privilege level may be merged with the stored first write-miss. To perform the merge, the privilege levels should be merged as well. In certain cases, the privilege levels may be merged by merging the privilege levels to the lower level of the privilege levels. For example, in an embodiment, a write operation may be associated with a two part privilege level such as root/guest-user/supervisor. A first write-miss may be received with a privilege level of root-user. This first write-miss may be written to the write miss buffer in the victim cache. A second write with privilege level of guest-supervisor may be received, the second write directed to an address within the set of addresses associated with the first write-miss. When merging the privilege levels of the two writes, the lower privilege level may be used, resulting in a merged privilege level of guest-user. In certain cases, merging the privilege levels may operate in the same way when merging is performed for multiple datapaths. In certain cases, privilege level merging may be encoded in the privilege merge table 736, indicating how different privilege levels may be merged. In certain cases, the privilege merge table 736 may be predefined. An example of a predefined privilege merge table 736 is shown in Table 1. In certain cases, the privilege merge table 736 may be configurable.

TABLE 1

| Privilege of Write Miss to be merged into Write Miss Buffer on Write Miss Buffer Hit | Current Privilege of Write Miss Buffer Hit line | New Privilege level of Write Miss Buffer line after transaction merge |
| --- | --- | --- |
| Guest-User | Guest-User | Guest-User |
| Guest-User | Guest-Supervisor | Guest-User |
| Guest-User | Root-User | Guest-User |
| Guest-User | Root-Supervisor | Guest-User |
| Guest-Supervisor | Guest-User | Guest-User |
| Guest-Supervisor | Guest-Supervisor | Guest-Supervisor |
| Guest-Supervisor | Root-User | Guest-User |
| Guest-Supervisor | Root-Supervisor | Guest-Supervisor |
| Root-User | Guest-User | Guest-User |
| Root-User | Guest-Supervisor | Guest-User |
| Root-User | Root-User | Root-User |
| Root-User | Root-Supervisor | Root-User |
| Root-Supervisor | Guest-User | Guest-User |
| Root-Supervisor | Guest-Supervisor | Guest-Supervisor |
| Root-Supervisor | Root-User | Root-User |
| Root-Supervisor | Root-Supervisor | Root-Supervisor |

In certain cases, write merging may be performed for color tags. For example, a first write-miss stored in the victim cache may be associated with a first color tag, such as red. With reference to FIG. 8, the first write-miss may be associated with an entry in the MESI RAM 800 with a bit set in the red tag 806 of a bit field. A second write associated with a second color tag may be merged with the stored first write-miss. To perform the merge, the color tags should be merged as well. In certain cases, the color tags may be merged by combining the color tags of the writes. For example, if both writes are red tagged, then the merged write remains red tagged. Similarly, the merged write would be blue tagged if both writes are blue tagged. If one write is red tagged and the other write is blue tagged, then the merged write is tagged both red and blue. Thus, if the second write to be merged is associated with a blue tag, the merged write may have a bit set in the red tag 806 of the bit field and a bit set in the blue tag 808 of the bit field. In certain cases, if a drain operation is then performed, for example for blue tags, the merged write would be drained. Similarly, if a drain operation is performed for red tags, the merged write would also be drained as the merged write is tagged as both red and blue.

Figure 9:
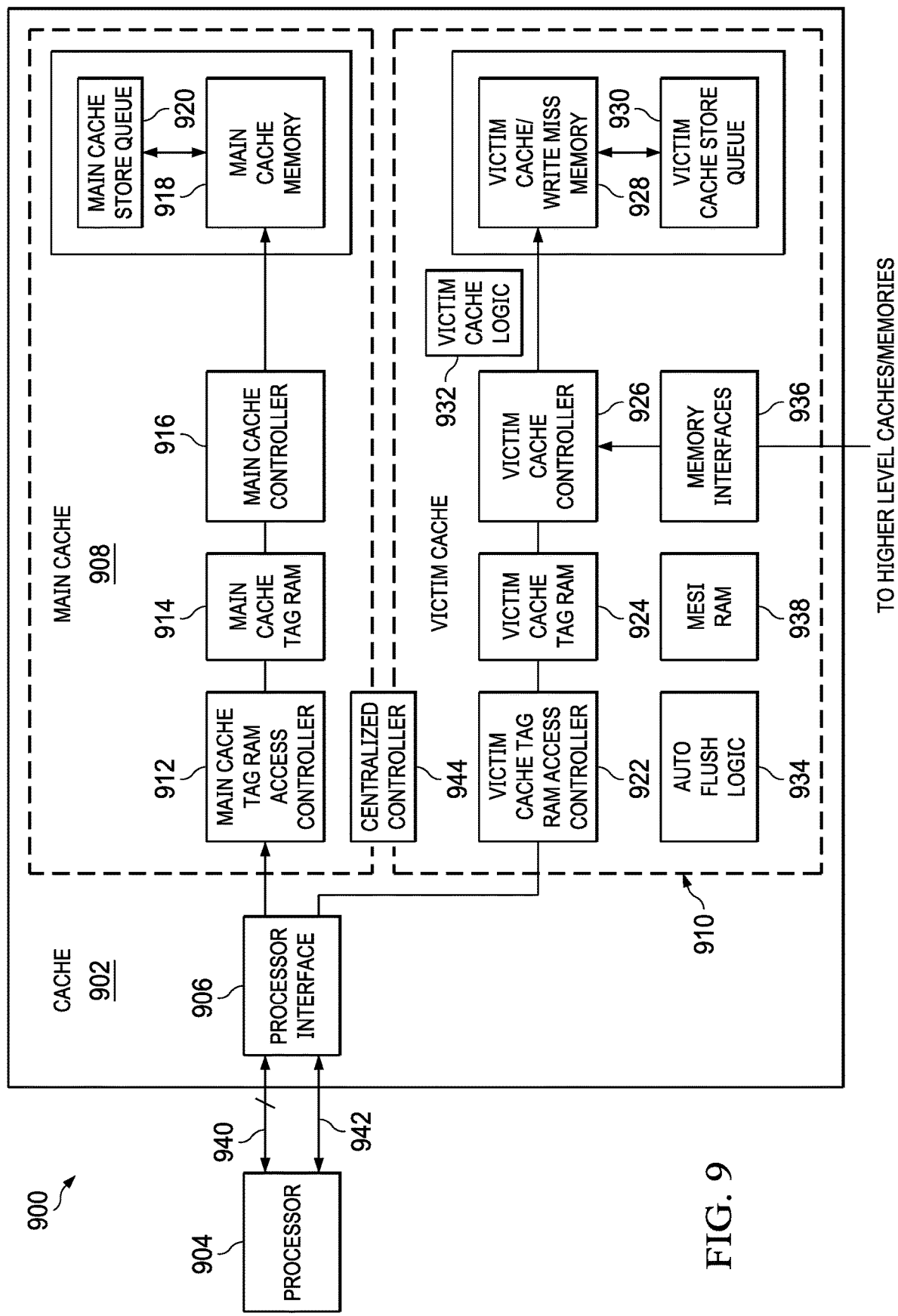
FIG. 9 is an architectural block diagram of a cache system including a write-miss buffer, in accordance with aspects of the present disclosure.

FIG. 9 is an architectural block diagram of a cache system 900 including a write-miss buffer, in accordance with aspects of the present disclosure. As shown, a cache 902 may receive cache requests from a processor 904 via a processor interface 906. In certain cases, the cache 902 may be configured to handle either scalar or vector data, or both. The cache 902 is logically divided into parallel sub-caches including a main cache 908 and a victim cache 910. While a single main cache 908 and victim cache 910 are shown, it may be understood that certain embodiments can include multiple main caches 908 and victim caches 910 pairs. In certain cases, there may be a different number of main caches 908 and victim caches 910. With respect to the main cache 908, a main cache tag RAM access controller 912 accesses and checks a main cache tag RAM 914 against memory addresses included in the cache requests to determine whether a memory address is stored in the main cache 908. A main cache controller 916 directs the appropriate allocation, eviction, arbitration, merge, etc. processes and reads/writes into the main cache memory 918. A main cache store queue structure 920, as described in conjunction with FIG. 3, provides features such as RMW, ECC, write merging, etc.

The overall architecture of the victim cache 910 is similar to that of main cache 908. For example, for a received memory request, a victim cache tag RAM access controller 922 accesses and checks a victim cache tag RAM 924 against memory addresses included in the cache requests to determine whether a memory address is stored in the victim cache 910. A victim cache controller 926 similarly directs the appropriate allocation, eviction, arbitration, merge, etc. processes and reads/writes into the victim cache memory 928. A victim cache store queue 930 provides RMW, ECC, and other features, as discussed in conjunction with FIG. 3. Victim cache logic 932 helps coordinate operations as between the victim cache 910 and the main cache 908. It may be understood that while the victim cache logic 932 is shown separately, the victim cache logic 932 may be integrated with or a part of other elements, such as the victim cache controller 926. In certain cases, the victim cache 908 includes certain elements which help enable the victim cache 908 to support write-miss buffer functionality. For example, auto flush logic 934 may monitor the processor interface 906 and direct draining the portions of the victim cache memory 928 allocated for write-miss buffering, for example, to higher level caches and memories via one or more memory interfaces 936. As another example, MESI RAM 938 or the victim cache tag RAM may be configured to include one or more bit fields to store state information regarding write-miss buffer entries stored in the victim cache 910.

In certain cases, the victim cache and main cache may include multiple datapaths while configured as parallel caches which appear as a single cache to a processor. Each datapath is configured to handle a particular command in parallel with the other datapaths. For example, a first datapath 910 may be handling a read command to the main cache while the second datapath 942 handles a write-miss to the victim cache. In an embodiment with two datapaths for the victim cache there may be four combinations of cache commands for a first datapath 940 and a second datapath 942: read/read, read/write, write/read, and write/write. In addition, each command combination could result in a cache hit/hit, hit/miss, miss/hit, or miss/miss. In addition, the two commands could potentially be addressed to the same memory address with varying privilege levels and color tags. In certain cases, to facilitate controlling the parallel caches, a centralized controller 944 may help coordinate handling of read and write requests as between the main cache 908 and the victim cache 910. In certain cases, the centralized controller 944 may be configured to handle coordination as between the main cache 908 and the victim cache 910 and handing off tasks for the main cache 908 and the victim cache 910 to the main cache controller 916 and victim cache controller 926, respectively. The centralized controller 944 may also detect and handle potential conflicts as well. For example, where read request received from a processor, the centralized controller 944 may check with the main cache 908 and the victim cache 910 to determine that the addressed memory location of the read request is not stored in either the main cache 908 nor the victim cache 910 and thus is a read miss. The centralized controller 944 may also check the victim cache 910 to determine that the addressed memory location is not stored as a write-miss in the victim cache 910, or is being flushed out of the victim cache 910. If the addressed memory location is stored as a write-miss in the victim cache 910, then the centralized controller 944 may stall the read request to flush the addressed memory location. The centralized controller 944 may then issue a request to a higher level cache or memory for the addressed memory location.

In certain cases, if a read or a write request is a hit in the main cache 908, the results of the victim cache 910 may be disregarded. Where the main cache 908 is configured as a one way associative cache, cache request conflicts as with multiple datapaths are straight forward. Cache request conflicts from the multiple datapaths may be an issue for in the victim cache 910 where the victim cache 910 is fully associative and can store write-miss entries as well as cache entries. Cache request conflicts for two datapaths may be handled as described in the following examples. Of note, in the following examples cache operations are described in the context of a particular datapath. However, it may be understood that the examples are directed to combinations of particular cache operations, and which datapath a particular cache operation is on does not matter.

In a first example, there is a cache read miss for the first datapath and a cache write hit for the second datapath, with two different memory addresses. In certain cases where the victim cache 910 is fully associative, cache requests can go to any location within the victim cache 910. Referring to FIG. 7, address generation 728 for a location within the victim cache occurs in the E2 pipestage along with address lookup in the victim cache tag RAM 704, thus address generation 728 for a location within the victim cache is performed before it is known whether an address of the cache request is a hit or miss. Once centralized controller 944 determines that there is a read miss on the main cache 908, a request to obtain the memory address of the read request is issued to a higher level cache or memory. Where the main cache 908 is one way associative, the memory address of the read request of the first datapath maps to a single location in the main cache 908. If there is already cached data in the single location, the already cached data is evicted from the main cache 908 to the victim cache 910 to the pre-generated location within the victim cache 910. If this pre-generated location is the same location the cache write of the second datapath is a hit on, a conflict occurs. This conflict may be detected by the centralized controller 944. As indicated above, address generation for a location within the victim cache 910 occurs before it is known whether the address of cache request is a hit or a miss, thus there is an address generated for a second location within the victim cache 910 for the cache write of the second datapath prior to the determination that the cache write is a hit. Based on the detection of the conflict, this second location within the victim cache may be used to store the data evicted from the main cache 908 by the read miss.

In another example, there may be a cache read miss for the first datapath and a cache write hit for the second datapath, as with the first example, but in this example, the cache read misses in the main cache and the cache write hits in the main cache as well. In certain cases, the main cache is a one-way associate cache (e.g., direct mapped cache) where particular memory addresses are mapped to particular locations within the main cache. In this example with a direct mapped cache, the cache read and the cache write are mapped to the same location in the main cache. In this example, due to the read miss, a request to obtain the memory address of the read request is issued to a higher level cache or memory and the already cached data is evicted from the main cache 908 to the victim cache 910 to a pre-generated location, here location A, within the victim cache 910. In this example, the cache write of the second datapath hits the same location in the main cache which is being evicted. One possible solution to such a conflict is to load the requested read miss from the higher level cache or memory directly to the victim cache in a separate location. Another solution to the conflict is for the centralized controller 944 to stall the read miss such that the already cached data is not evicted to the victim cache 910 until after the cache write of the second datapath completes to location A in the main cache and location A is then evicted to the victim cache. In certain cases, the stall may occur while waiting for the memory write and eviction to complete.

As another example, a first cache write may be received on the first datapath for the victim cache 910 and a second cache write is also received on the second datapath for the victim cache 910. If the first cache write and the second cache write are addressed to different memory addresses, then both cache writes may proceed in parallel to the victim cache 910. If the first cache write and the second cache write are both addressed to the same memory address and both are cache misses, then the victim cache controller 926 allocates a single location in the victim cache write-miss memory 928 and merges the first cache write and the second cache write in the victim cache store queue 930. The merged data may then be written to the victim cache write-miss memory 928 along with merged byte enable, privilege, and color tag information. If the first cache write and the second cache write are both addressed to the same memory address and both are cache hits, both the first cache write and the second cache write are merged into the cache at the hit location.

As another example a cache read may be received on the first datapath for the victim cache 910 and a cache write may be received on the second datapath for the victim cache 910. In the cases where the cache read is a hit and the cache write is a hit to different locations in the victim cache 910, the cache read and cache write proceed in parallel without conflicts. In the case the cache read is a hit and the cache write is a miss to different locations in the victim cache 910, the cache read and cache write also proceed in parallel without conflicts. In the case the cache read is a miss and the cache write is a hit to different locations in the victim cache 910, the cache read may use an address generated for a location within the victim cache 910 for the cache write as discussed above. In the case the cache read is a miss and the cache write is a miss to different locations in the victim cache 910, both the cache read and the cache write use addresses generated for locations within the victim cache 910.

In another example, a cache read may be received on the first datapath for the main cache 908 and a cache write may be received on the second datapath for the main cache 908. In certain cases, the cache read may be a hit for a location (e.g., cache line or slot) of the main cache 908. The cache write may also be a hit for the same location of the main cache 908. In such a case, the cache read and the cache write may proceed in parallel without conflicts as the cache read may be performed relatively quickly and conclude before the cache write needs to access main cache location as the cache write proceeds through the store queue. In another case, the cache read may be a hit for a location in the main cache 908. The cache write may be a miss for the same location in the main cache 908. In such a case, the cache commands proceed in parallel normally as the cache read may complete prior to the cache write needing to access the cache location. In another case, the cache read may be a miss for a location in the main cache 908. The cache write may be a hit for the same location in the main cache 910. In such a case, as similar to that discussed above, the cache read may be stalled until after the cache write of the second datapath completes to the location in the main cache 908 and is evicted to the victim cache 908. The cache read then proceeds to read the set of addresses from the higher level cache or memory into the main cache 910. In another case, the cache read may be a miss for a first location in the main cache 908. The cache write may also be a miss for the same location in the main cache 908. In such a case, the cache read and the cache write may proceed in parallel without conflicts.

In another example, a cache read may be received on the first datapath for the victim cache 910 and a cache write may be received on the second datapath for the victim cache 910. In certain cases, the cache read may be a hit for an address stored in the victim cache 910. The cache write may also be a hit for the same address stored in the victim cache 910. In such a case, the cache read may proceed first and the cache write may be stalled until after the cache read completes. Alternatively, the order of the cache write and cache read may be based on the datapath on which the cache write and cache read are received, with the cache command arriving on a lower (or higher) numbered datapath being completed before the other cache command. In certain cases, the cache read may be a miss for an address stored in the victim cache 910. The cache write may also be a miss for the same address stored in the victim cache 910. In such a case, the cache write command may be forwarded to a higher level cache or memory and then the cache read may obtain the data from the higher level cache or memory after the cache write command completes for storage into the victim cache 910.

In another example, a first cache read may be received on the first datapath for the victim cache 910 and a second cache read may be received on the second datapath for the victim cache 910. If the first cache read and the second cache read are for different memory addresses, then there are no conflicts for either hits or misses. In certain cases, the first cache read may be a miss for a first address of a set of addresses. The second cache read may also be a miss for a second address of the same set of addresses. If the first cache read and the second cache read have different priority levels, a higher level cache or memory is accessed based on the higher of the different priority levels. Otherwise, the higher level cache or memory is accessed and the set of memory addresses obtained for storage in the victim cache 910. The case where the first cache read and the second cache read are for the same address is handled identically.

Figure 10:
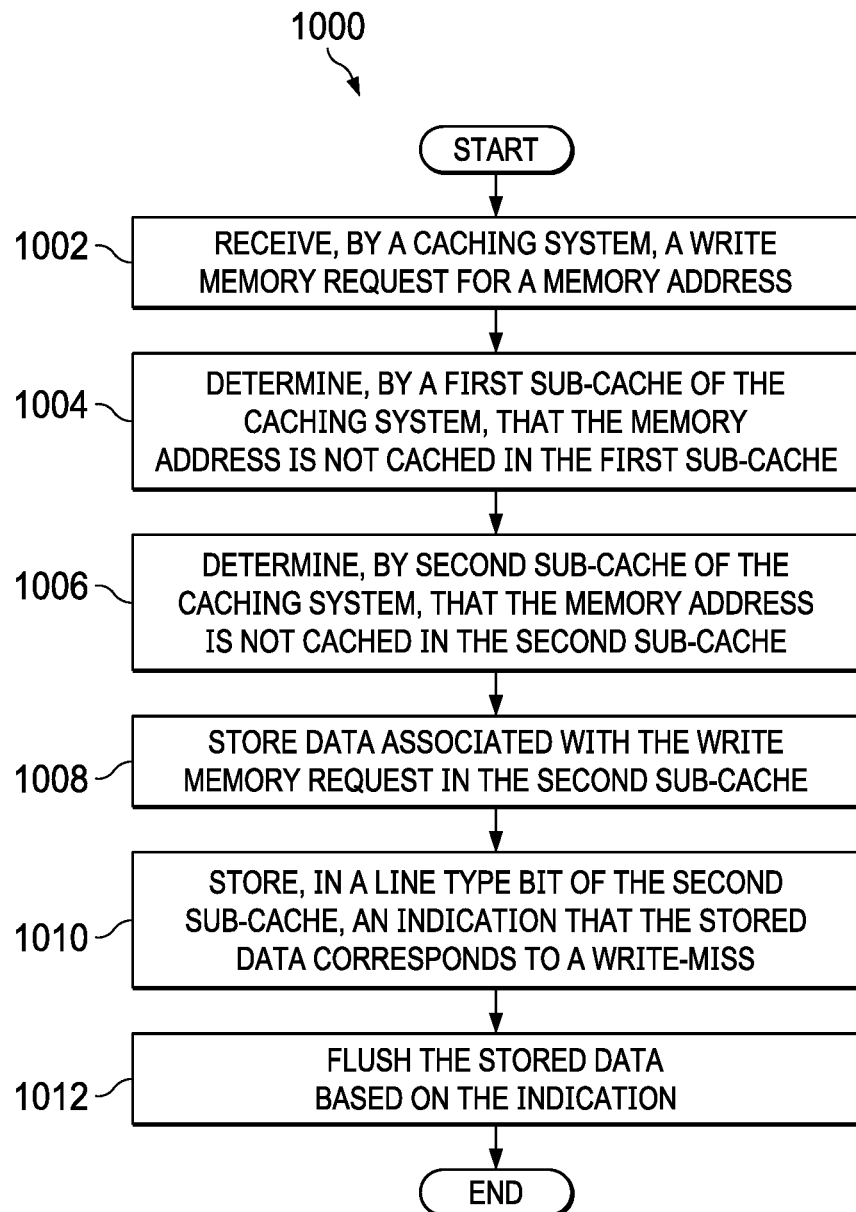
FIGS. 10-16 are flow diagrams illustrating techniques for caching data, in accordance with aspects of the present disclosure.

FIG. 10 is a flow diagram illustrating a technique for caching data 1000, in accordance with aspects of the present disclosure. At block 1002, a caching system receives a write memory request for a memory address. For example, a caching system, such as a L1 cache, can receive, via a processor interface, a write request from a processor. At block 1004, a first sub-cache of the caching system determines that the memory address is not cached in the first sub-cache. For example, the caching system may include two parallel caches, a main cache and a victim cache. Memory addresses of cache requests may be checked as against both the main cache and victim cache in parallel. A write-miss occurs when a write request is received for a memory address not contained within the caching system. At block 1006, second sub-cache of the caching system determines that the memory address is not cached in the second sub-cache. At block 1008, data associated with the write memory request is stored in the second sub-cache. For example, the data of the write memory request may be stored in the victim cache. Additionally, the address associated with the write memory request may be stored in a tag RAM of the victim cache and byte enable logic associated with the write memory request may be stored in a byte enable memory of the victim cache. At block 1010, an indication that the stored data corresponds to a write-miss is stored in a line type bit of the second sub-cache. For example, the victim cache includes a line type bit associated with lines of the victim cache. A bit may be set in the line type bit indicating that a particular line of the victim cache includes a write-miss. At block 1012, the stored data may be flushed based on the indication. For example, stored write-miss data may be flushed the victim cache to a higher level memory by checking the line type bits of the cache lines and flushing the lines associated with write-misses.

Figure 11:
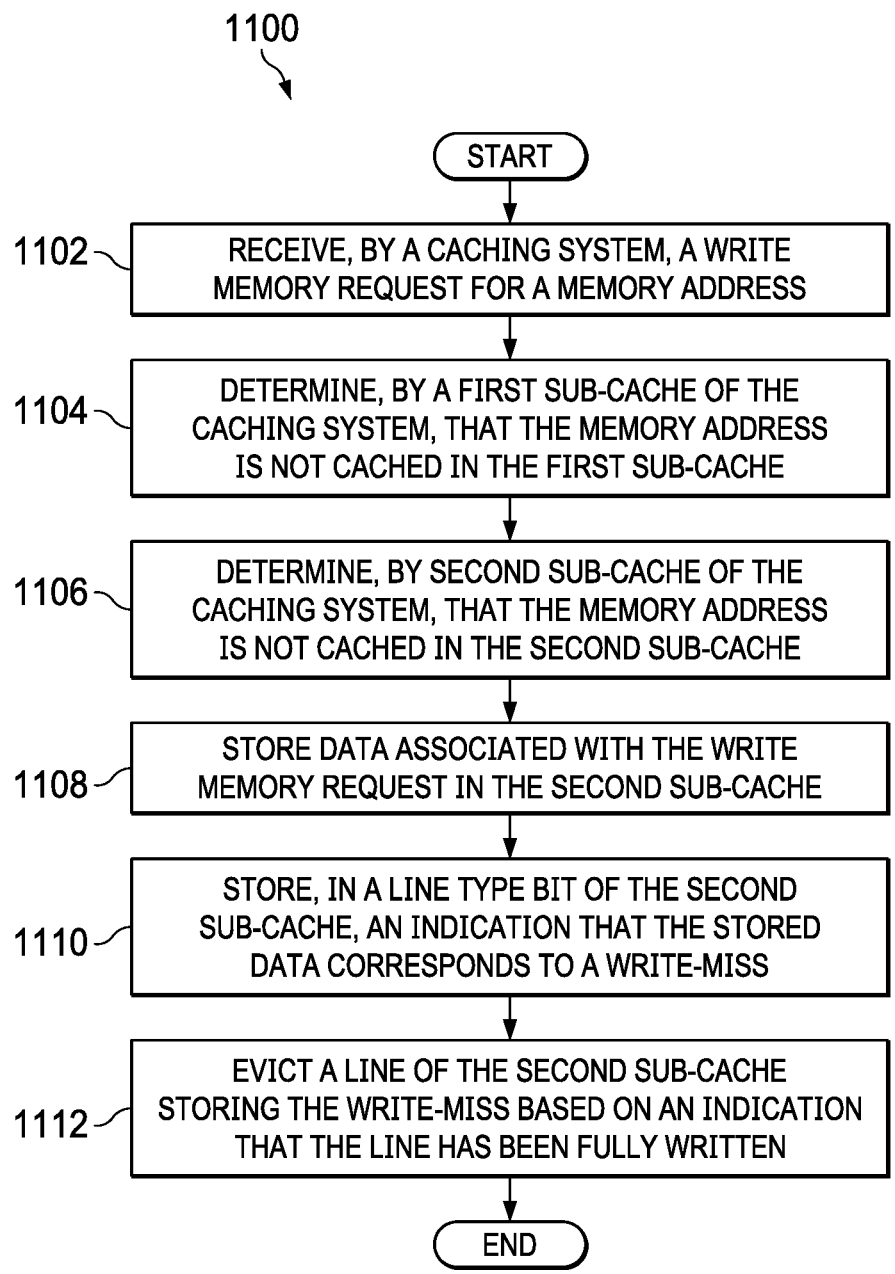

FIG. 11 is a flow diagram illustrating a technique for caching data 1100, in accordance with aspects of the present disclosure. At block 1102, a caching system receives a write memory request for a memory address. For example, a caching system, such as a L1 cache, can receive, via a processor interface, a write request from a processor. At block 1104, a first sub-cache of the caching system determines that the memory address is not cached in the first sub-cache. For example, the caching system may include two parallel caches, a main cache and a victim cache.

Memory addresses of cache requests may be checked as against both the main cache and victim cache in parallel. A write-miss occurs when a write request is received for a memory address not contained within the caching system. At block 1106, second sub-cache of the caching system determines that the memory address is not cached in the second sub-cache. At block 1108, data associated with the write memory request is stored in the second sub-cache. For example, the data of the write memory request may be stored in the victim cache. Additionally, the address associated with the write memory request may be stored in a tag RAM of the victim cache and byte enable logic associated with the write memory request may be stored in a byte enable memory of the victim cache. At block 1110, an indication that the stored data corresponds to a write-miss is stored in a line type bit of the second sub-cache. For example, the victim cache includes a line type bit associated with lines of the victim cache. A bit may be set in the line type bit indicating that a particular line of the victim cache includes a write-miss. At block 1112, a line of the second sub-cache storing the write-miss is evicted based on an indication that the line has been fully written. For example, a bit may be calculated based on the byte enable logic indicating whether all, or half, of the bytes of a cache line have been filled with write data. Cache lines which are filled, or half filled, may be evicted from the victim cache based on the bit.

Figure 12:
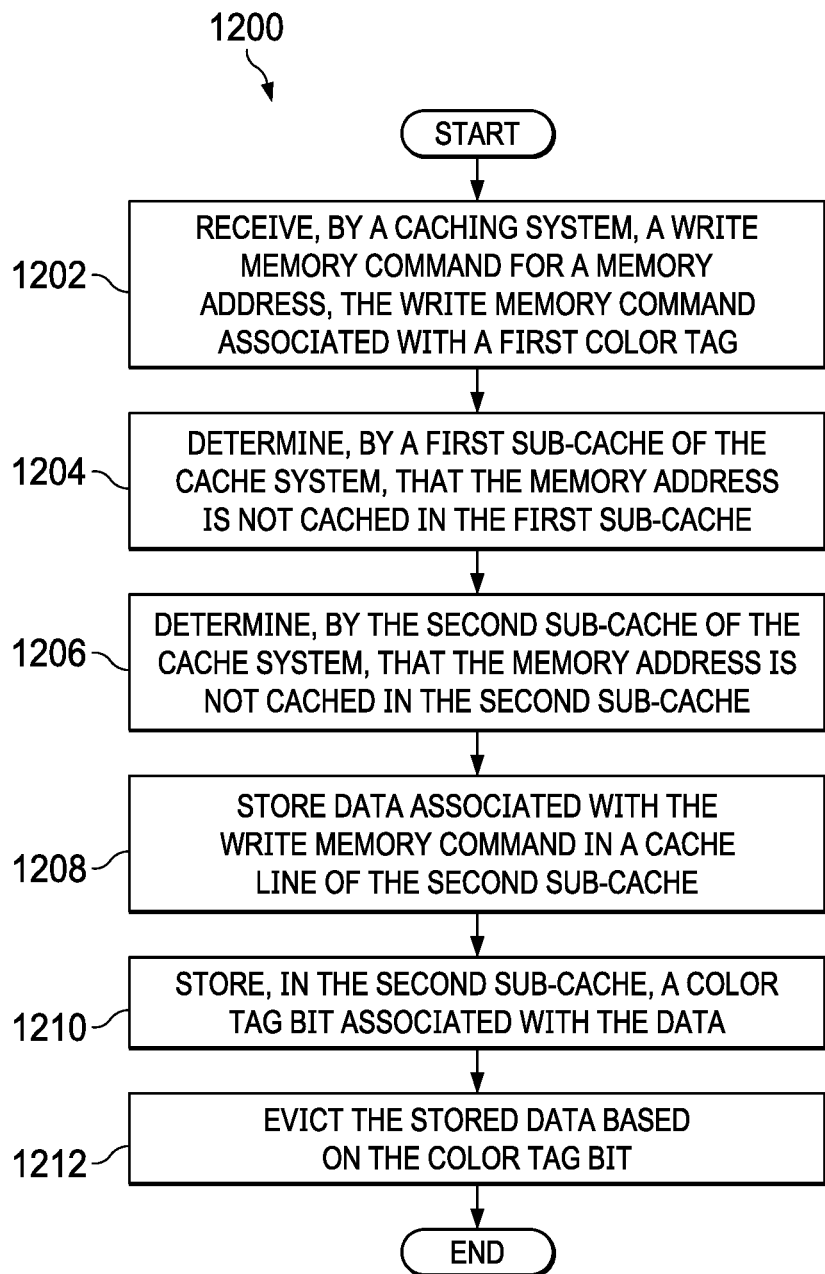

FIG. 12 is a flow diagram illustrating a technique for caching data 1200, in accordance with aspects of the present disclosure. At block 1202, a caching system receiving a write memory command for a memory address, the write memory command associated with a first privilege level. For example, a caching system, such as a L1 cache, can receive, via a processor interface, a write request from a processor. At block 1204, a first sub-cache of the caching system determines that the memory address is not cached in the first sub-cache. For example, the caching system may include two parallel caches, a main cache and a victim cache. Memory addresses of cache requests may be checked as against both the main cache and victim cache in parallel. A write-miss occurs when a write request is received for a memory address not contained within the main cache nor the victim cache. At block 1206, a second sub-cache of the caching system determines that the memory address is not cached in the second sub-cache, wherein the second sub-cache is configured to store, in parallel with the first sub-cache, cache data evicted from the first sub-cache and write-memory commands that are not cached in the first sub-cache. At block 1208, data associated with the write memory command is stored in the second sub-cache. At block 1210, a color tag bit associated with the data is stored in the second sub-cache. For example, a color tag bit may be stored within a bit field of a memory of the second sub-cache, such as the MESI RAM. At block 1212, the stored data is evicted based on the color tag bit. For example, cache lines storing write miss data associated with a particular color tag bit may be evicted while the processor is asserting a drain signal and a color tag priority indication. After all cache lines with the particular color tag bit have been drained, the caching system may assert an idle signal. If the processor continues to assert the drain signal, other cache lines storing write miss data associated with other color tags may also be evicted.

Figure 13:
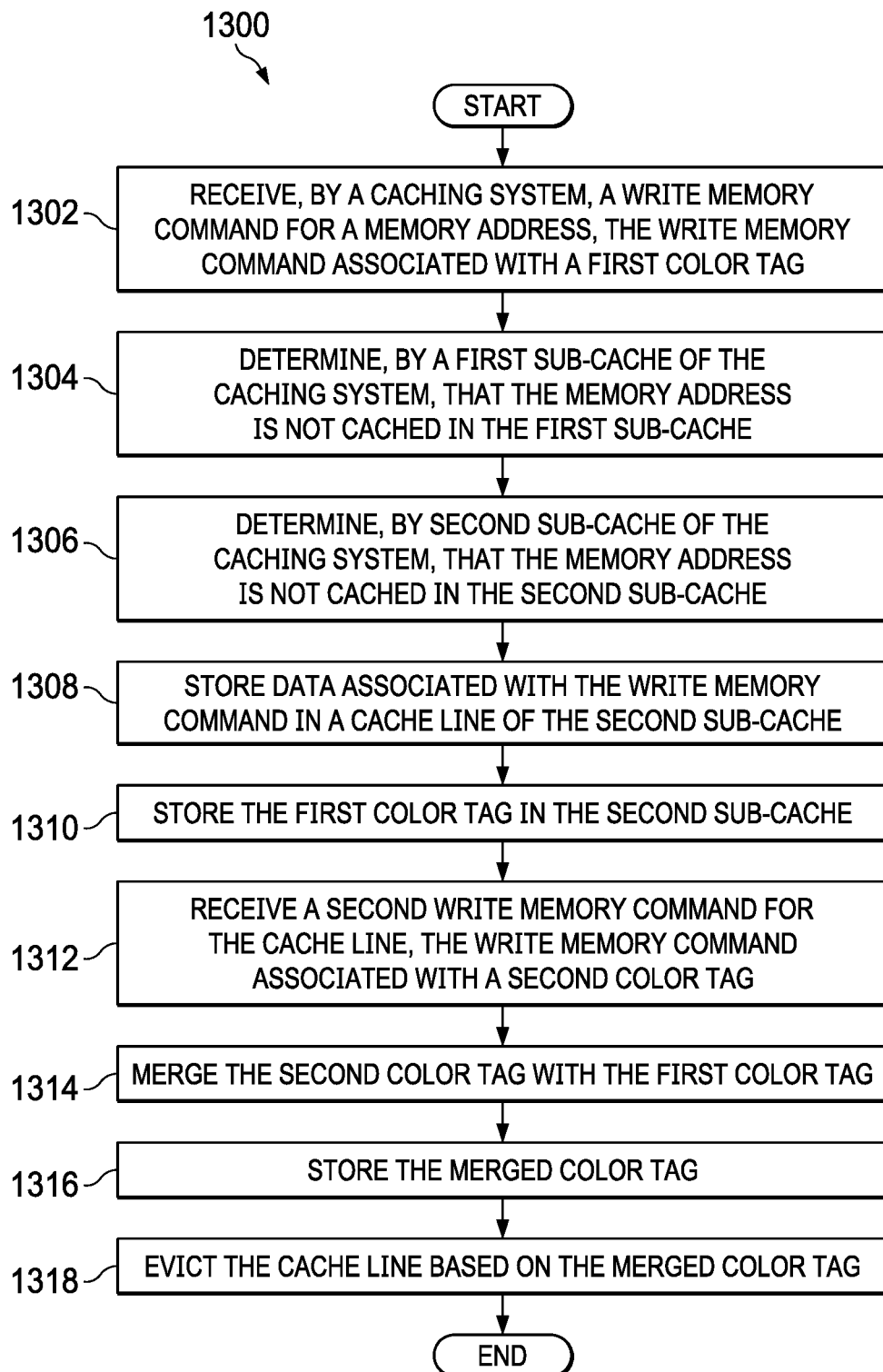

FIG. 13 is a flow diagram illustrating a technique for caching data 1300, in accordance with aspects of the present disclosure. At block 1302, a caching system receives a write memory command for a memory address, the write memory command associated with a first color tag. For example, a caching system, such as a L1 cache, can receive, via a processor interface, a write request from a processor. The write request may include in an indication of a color tag associated with the write request. At block 1304, a first sub-cache of the caching system determines that the memory address is not cached in the first sub-cache. For example, the caching system may include two parallel caches, a main cache and a victim cache. Memory addresses of cache requests may be checked as against both the main cache and victim cache in parallel. A write-miss occurs when a write request is received for a memory address not contained within the caching system. At block 1306, second sub-cache of the caching system determines that the memory address is not cached in the second sub-cache. At block 1308, data associated with the write memory command is stored in a cache line of the second sub-cache. For example, the data of the write request may be stored in a cache line of the victim cache. Additionally, the address associated with the write memory request may be stored in a tag RAM of the victim cache and byte enable logic associated with the write memory request may be stored in a byte enable memory of the victim cache. At block 1310, the first color tag is stored in the second sub-cache. For example, the color tag may be stored using two bits within a bit field of a memory of the second sub-cache, such as the MESI RAM. At block 1312, a second write memory command for the cache line is received, the write memory command associated with a second color tag. For example, a second write request to a memory address targeting the same cache line as the first write request may be received. The second write request is associated with a second color tag. The second color tag may be the same or different from the first color tag. At block 1314, the second color tag is merged with the first color tag. For example, where the first color tag and the second color tag represent the same color, merging the two tags continues to set that color tag. Where the two color tags are different, merging may set both color tags. At block 1316, the merged color tag is stored. At block 1318, the cache line may be evicted based on the merged color tag. For example, where the first color tag and the second color tag represent the same color, eviction may be based on that color tag. Where the two color tags are different, eviction may be based on either color tag.

Figure 14:
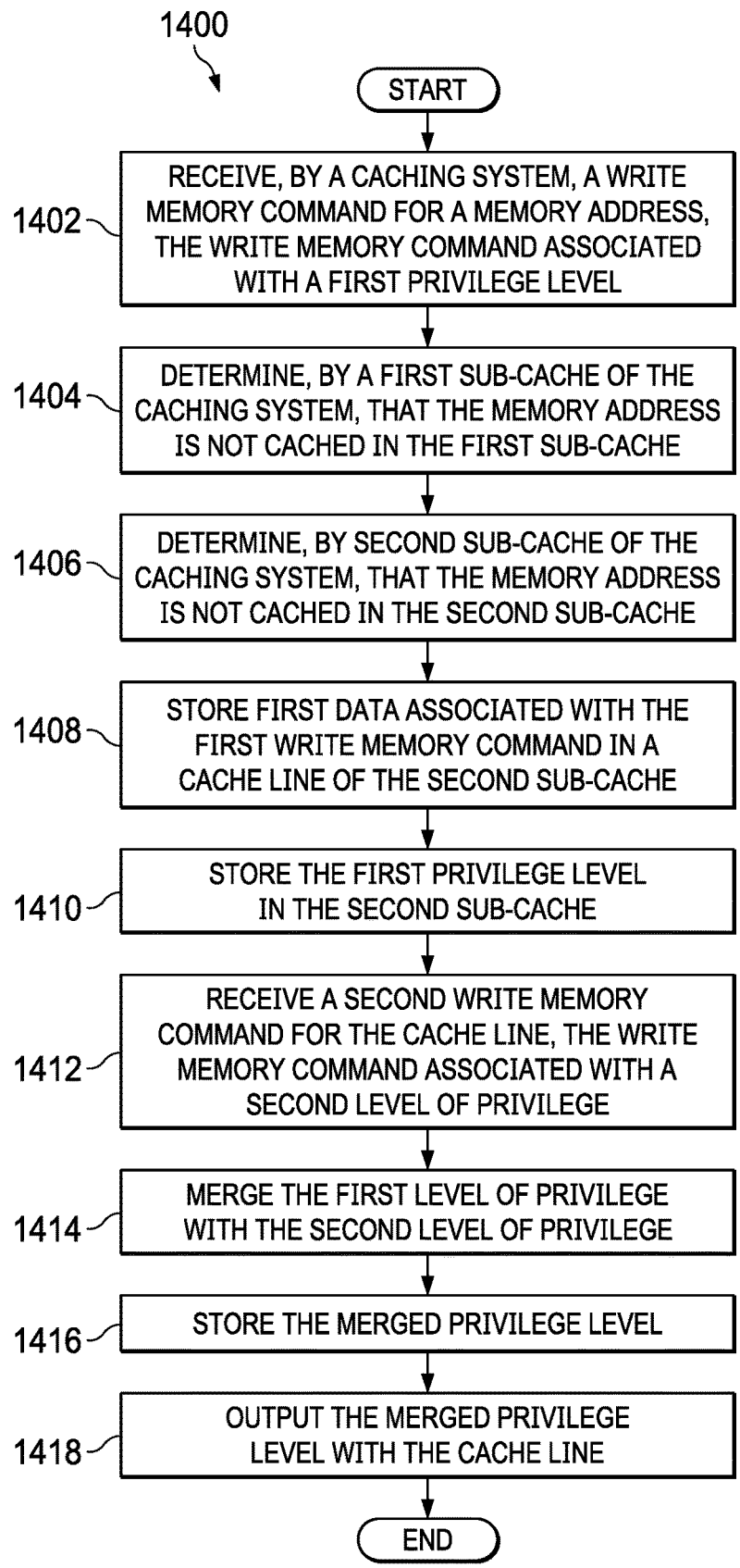

FIG. 14 is a flow diagram illustrating a technique for caching data 1400, in accordance with aspects of the present disclosure. At block 1402, a caching system receiving a first write memory command for a memory address, the first write memory command associated with a first privilege level. For example, a caching system, such as a L1 cache, can receive, via a processor interface, a write request from a processor. At block 1404, a first sub-cache of the caching system determines that the memory address is not cached in the first sub-cache. For example, the caching system may include two parallel caches, a main cache and a victim cache. Memory addresses of cache requests may be checked as against both the main cache and victim cache in parallel. A write-miss occurs when a write request is received for a memory address not contained within the main cache nor the victim cache. At block 1406, a second sub-cache of the caching system determines that the memory address is not cached in the second sub-cache, wherein the second sub-cache is configured to store, in parallel with the first sub-cache, cache data evicted from the first sub-cache and write-memory commands that are not cached in the first sub-cache. At block 1408, first data associated with the first write memory command is stored in a cache line of the second sub-cache. At block 1410, the first privilege level is stored in the second sub-cache. For example, the first privilege level may comprise a two part privilege level, such as root/guest-user/supervisor. This two part privilege level may be stored using two bits within a bit field of a memory of the second sub-cache, such as the MESI RAM. At block 1412, a second write memory command for the cache line is received, the second write memory command associated with a second level of privilege. For example, a second write request to a memory address targeting the same cache line as the first write request may be received. The second write request is associated with a second privilege level, which may be the same or different from the first write request. At block 1414, the first level of privilege with the second level of privilege are merged. For example, the privilege levels may be merged based on a privilege merge table or may be merged by selecting the lower privilege level of the privilege levels being merged. At block 1416, the merged privilege level are stored. At block 1418, the merged privilege level is output with the cache line. For example, the cache line including a merged first write request and second write request may be evicted in a store miss packet including the merged privilege level to a higher level cache or memory.

Figure 15:
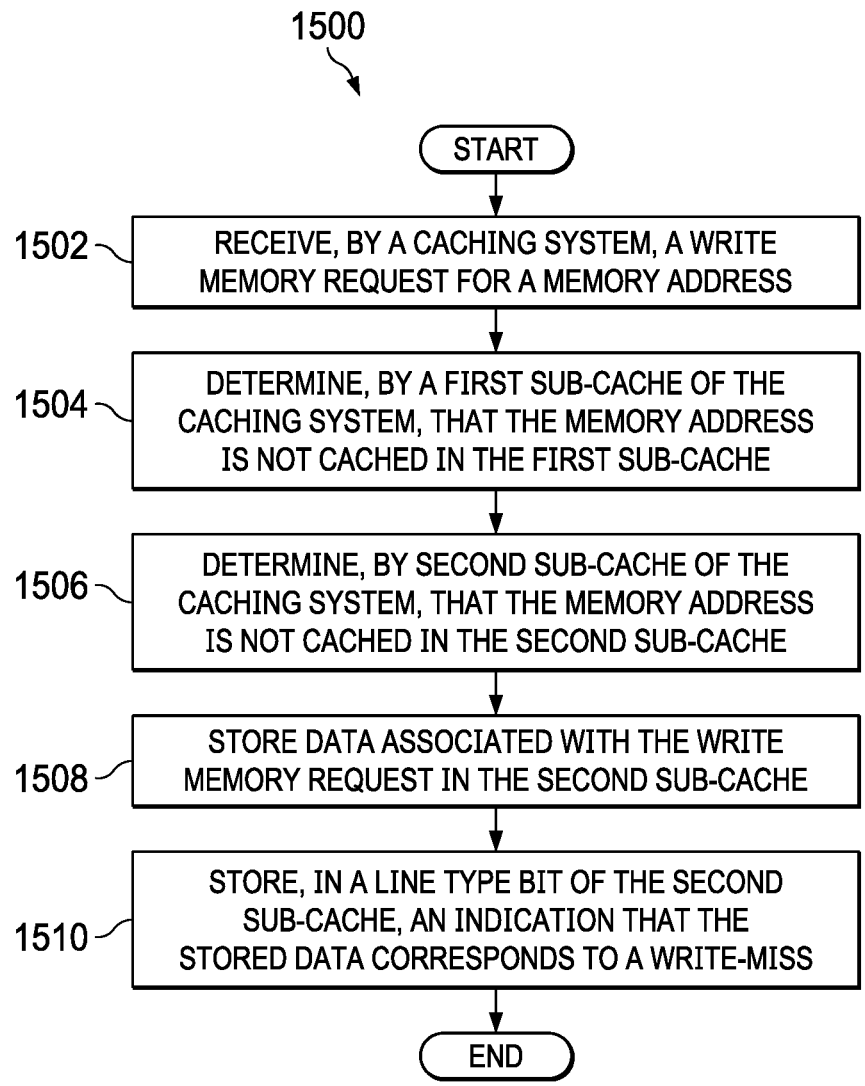

FIG. 15 is a flow diagram illustrating a technique for caching data 1500, in accordance with aspects of the present disclosure. At block 1502, a caching system receives a write memory request for a memory address. For example, a caching system, such as a L1 cache, can receive, via a processor interface, a write request from a processor. At block 1504, a first sub-cache of the caching system determines that the memory address is not cached in the first sub-cache. For example, the caching system may include two parallel caches, a main cache and a victim cache. Memory addresses of cache requests may be checked as against both the main cache and victim cache in parallel. A write-miss occurs when a write request is received for a memory address not contained within the caching system. At block 1506, second sub-cache of the caching system determines that the memory address is not cached in the second sub-cache. At block 1508, data associated with the write memory request is stored in the second sub-cache. For example, the data of the write memory request may be stored in the victim cache. Additionally, the address associated with the write memory request may be stored in a tag RAM of the victim cache and byte enable logic associated with the write memory request may be stored in a byte enable memory of the victim cache. At block 1510, an indication that the stored data corresponds to a write-miss is stored in a line type bit of the second sub-cache. For example, the victim cache includes a line type bit associated with lines of the victim cache. A bit may be set in the line type bit indicating that a particular line of the victim cache includes a write-miss.

Figure 16:
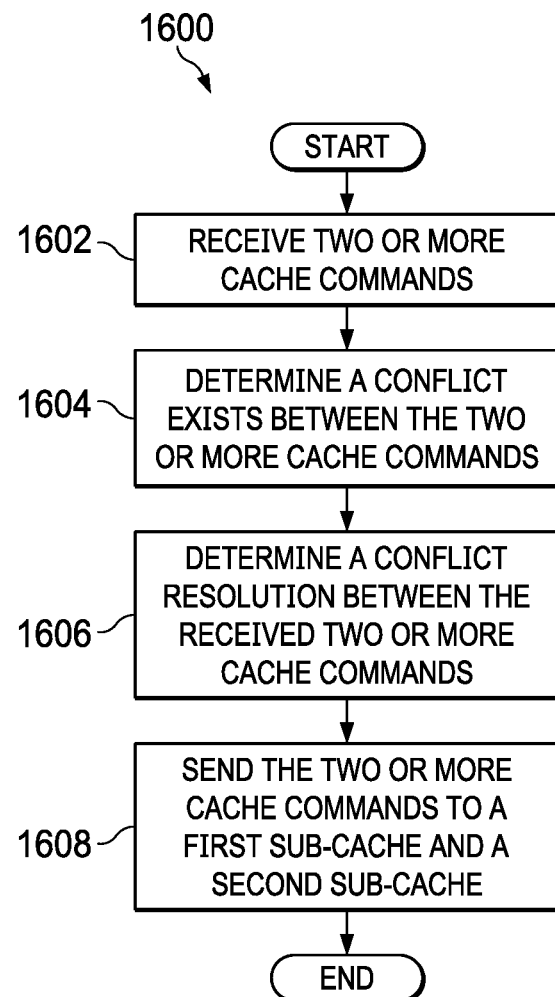

FIG. 16 is a flow diagram illustrating a technique for caching data 1600, in accordance with aspects of the present disclosure. At block 1602, a caching system receives two or more cache commands. For example, a caching system, such as a L1 cache, can receive, via a processor interface, a multiple cache commands using, for example, two or more data paths. At block 1604, a conflict is determined to exist between the two or more cache commands. For example, a cache controller may determine that a cache conflict exists as between the two cache commands. A conflict can arise when the two cache commands cause conflicting changes to the same cache location. At block 1606, a conflict resolution is determined between the received two or more cache commands. At block 1608, two or more cache commands are sent to a first sub-cache and a second sub-cache, wherein the second sub-cache is configured to store, in parallel with the first sub-cache, cache data evicted from the first sub-cache and write-memory commands that are not cached in the first sub-cache.

Examples

In the following section, further exemplary embodiments are provided.

Example 1 includes a caching system comprising: a first sub-cache; and a second sub-cache in parallel with the first sub-cache, wherein the second sub-cache includes: a set of cache lines; line type bits configured to store an indication that a corresponding cache line of the set of cache lines is configured to store write-miss data; and an eviction controller configured to flush stored write-miss data based on the line type bits.

Example 2 includes the caching system of example 1, wherein the second sub-cache further comprises: a tag random access memory (RAM) configured to store a memory address associated with the stored write-miss data; and a byte enable memory configured to store byte enable logic associated with the stored write-miss data, and wherein the eviction controller is configured to flush stored write-miss data by transmitting a memory write request to a higher level memory based the stored memory address and stored byte enable logic.

Example 3 includes the caching system of example 1, wherein the caching system further includes a processor interface, and wherein the eviction controller is further configured to: monitor activity on the processor interface; and flush stored write-miss data based on the monitored activity.

Example 4 includes the caching system of example 3, wherein monitoring activity on the processor interface comprises detecting idle activity on the processor interface.

Example 5 includes the caching system of example 4, wherein detecting idle activity comprises determining whether memory requests have been received for a predetermined number of clock cycles.

Example 6 includes the caching system of example 4, wherein the eviction controller is further configured to: determine that activity on the processor interface has resumed; and cancel flushing of the stored write-miss data.

Example 7 includes the caching system of example 6, wherein determining that activity on the processor interface has resumed comprises detecting a cache request receipt from the processor.

Example 8 includes a method for caching data, comprising: receiving, by a caching system, a write memory request for a memory address; determining, by a first sub-cache of the caching system, that the memory address is not cached in the first sub-cache; determining, by second sub-cache of the caching system, that the memory address is not cached in the second sub-cache; storing data associated with the write memory request in the second sub-cache; storing, in a line type bit of the second sub-cache, an indication that the stored data corresponds to a write-miss; and flushing the stored data based on the indication.

Example 9 includes the method of example 8, wherein flushing the stored data comprises transmitting, by the second-sub cache, a memory write request to a higher level memory.

Example 10 includes the method of example 8, further comprising monitoring activity on a processor interface, and wherein flushing the stored data is further based on the monitored activity.

Example 11 includes the method of example 10, wherein monitoring activity on the processor interface comprises detecting idle activity on the processor interface.

Example 12 includes the method of example 11, wherein detecting idle activity comprises determining that memory requests have not been received for a predetermined number of clock cycles.

Example 13 includes the method of example 11, further comprising: determining that activity on the processor interface has resumed; and cancelling flushing of the stored write-miss data.

Example 14 includes the method of example 13, wherein determining that activity on the processor interface has resumed comprises detecting a cache request receipt.

Example 15 includes a device comprising: a processor; a first sub-cache; and a second sub-cache in parallel with the first sub-cache, wherein the second sub-cache includes: a set of cache lines; line type bits configured store an indication that a corresponding cache line of the set of cache lines is configured to store write-miss data; and an eviction controller configured to flush stored write-miss data based on the line type bits.

Example 16 includes the device of example 15, wherein the second sub-cache further comprises: a tag random access memory (RAM) configured to store a memory address associated with the stored write-miss data; and a byte enable memory configured to store byte enable logic associated with the stored write-miss data, and wherein the eviction controller is configured to flush stored write-miss data by transmitting a memory write request to a higher level memory based the stored memory address and stored byte enable logic.

Example 17 includes device of example 15, wherein the caching system further includes a processor interface, and wherein the eviction controller is further configured to: monitor activity on the processor interface; and flush stored write-miss data based on the monitored activity.

Example 18 includes the device of example 17, wherein monitoring activity on the processor interface comprises detecting idle activity on the processor interface.

Example 19 includes the device of example 18, wherein detecting idle activity comprises determining whether memory requests have been received for a predetermined number of clock cycles.

Example 20 includes the device of example 18, wherein the eviction controller is further configured to: determine that activity on the processor interface has resumed; and cancel flushing of the stored write-miss data.

Example 21 includes a caching system comprising: a first sub-cache; and a second sub-cache, coupled in parallel with the first cache, for storing cache data evicted from the first sub-cache and write-memory commands that are not cached in the first sub-cache, and wherein the second sub-cache includes: color tag bits configured to store an indication that a corresponding cache line of the second sub-cache storing write miss data is associated with a color tag, and an eviction controller configured to evict cache lines of the second sub-cache storing write-miss data based on the color tag associated with the cache line.

Example 22 includes the caching system of Example 21, wherein the second sub-cache includes a bit field configured to store a state of the color tags.

Example 23 includes the caching system of Example 22, wherein the bit field includes a bit storing the state for each color tag.

Example 24 includes the caching system of Example 23, wherein the bit field is stored in a memory tracking a modified, exclusive, shared, and invalid (MESI) state of entries in the second sub-cache.

Example 25 includes the caching system of Example 24, wherein the MESI memory is configured to store an indication that the corresponding cache line of the second sub-cache is storing write-miss data.

Example 26 includes the caching system of Example 21, wherein the caching system further includes a processor interface, and wherein the eviction controller is further configured to: receive, on the processor interface, a color tag priority indication; and evict cache lines of the second sub-cache storing write-miss data based on the received color tag priority indication.

Example 27 includes the caching system of claim 6, wherein the eviction controller is further configured to assert an idle signal on the processor interface after all cache lines of the second sub-cache storing write-miss data with color tag bits corresponding to the color tag priority indication have been evicted.

Example 28 includes a method for caching data, comprising receiving, by a caching system, a write memory command for a memory address; determining, by a first sub-cache of the caching system, that the memory address is not cached in the first sub-cache; determining, by second sub-cache of the caching system, that the memory address is not cached in the second sub-cache, wherein the second sub-cache is configured to store, in parallel with the first sub-cache, cache data evicted from the first sub-cache and write-memory commands that are not cached in the first sub-cache; storing data associated with the write memory command in the second sub-cache; storing, in the second sub-cache, a color tag bit associated with the data; and evicting the stored data based on the color tag bit.

Example 29 includes the method of Example 28, further comprising: receiving a color tag priority indication from a processor; receiving a drain signal from the processor; and wherein evicting the stored data is based on the received color tag priority indication.

Example 30 includes the method of claim Example 29, further comprising: asserting an idle signal after all cache lines of the second sub-cache storing write-miss data with color tag bits corresponding to the color tag priority indication have been evicted.

Example 31 includes the method of Example 30, further comprising: continuing to receive the drain signal from the processor; and evicting stored data with color tag bits which do not correspond to the color tag priority indication.

Example 32 includes the method of Example 39, further comprising determining that storing the data has not been completed; and waiting until the data has been stored, Example 33 includes the method of Example 38, further comprising storing the color tag bit in a bit field associated with a corresponding color tag bit.

Example 34 includes a device comprising: a processor; a first sub-cache; and a second sub-cache, coupled in parallel with the first sub-cache, for storing cache data evicted from the first sub-cache and write-memory commands that are not cached in the first sub-cache, and wherein the second sub-cache includes: color tag bits configured to store an indication that a corresponding cache line of the second sub-cache storing write-miss data is associated with a color tag, and an eviction controller configured to evict the cache line of the second sub-cache storing write-miss data based on the color tag associated with the cache line.

Example 35 includes the device of Example 34, wherein the second sub-cache includes a bit field configured to store a state of the color tags.

Example 36 includes the device of Example 35, wherein the bit field includes a bit storing the state for each color tag.

Example 37 includes the device of Example 36, wherein the bit field is stored in a memory tracking a modified, exclusive, shared, and invalid (MESI) state of entries in the second sub-cache.

Example 38 includes the device of Example 37, wherein the MESI memory is configured to store an indication that the corresponding cache line of the second sub-cache is storing write-miss data.

Example 39 includes the device of Example 34, wherein the caching system further includes a processor interface, and wherein the eviction controller is further configured to: receive, on the processor interface, a color tag priority indication; and evict cache lines of the second sub-cache storing write-miss data based on the received color tag priority indication.

Example 40 includes the device of Example 39, wherein the eviction controller is further configured to assert an idle signal on the processor interface after all cache lines of the second sub-cache storing write-miss data with color tag bits corresponding to the color tag priority indication have been evicted.

Example 41 includes a caching system comprising: a first sub-cache; and a second sub-cache, coupled in parallel with the first sub-cache, for storing cache data evicted from the first sub-cache and write-memory commands that are not cached in the first sub-cache, the second sub-cache including: color tag bits configured to store an indication that a corresponding line of the second sub-cache is associated with a color tag; and an eviction controller configured to evict cache lines of the second sub-cache storing write-memory data based on the color tag associated with the line, and wherein the second sub-cache is further configured to: receive a first write memory command for a memory address, the write memory command associated with a first color tag; store first data associated with the first write memory command in a cache line of the second sub-cache; store the first color tag in the second sub-cache; receive a second write memory command for the cache line, the write memory command associated with a second color tag; merge the second color tag with the first color tag; store the merged color tag; and evict the cache line based on the merged color tag.

Example 42 includes the caching system of Example 41, wherein the first color tag and the second color tag represent the same color tag.

Example 43 includes the caching system of Example 41, wherein the first color tag and the second color tag represent different color tags, and wherein the merged color tag comprises a first bit representing the first color tag and a second bit representing the second color tag.

Example 44 includes the caching system of Example 43, wherein the second sub-cache is further configured to evict the cache line based on the first color tag.

Example 45 includes the caching system of Example 44, wherein the second sub-cache is further configured to evict the cache line based on the second color tag.

Example 46 includes the caching system of Example 41, wherein the first color tag and second color tag are stored in a bit field in a memory tracking modified, exclusive, shared, and invalid (MESI) state of entries in the second sub-cache data.

Example 47 includes the caching system of Example 46, wherein the bit field includes a bit storing the state for each color tag.

Example 48 includes a method for caching data, comprising: receiving, by a caching system, a write memory command for a memory address, the write memory command associated with a first color tag; determining, by a first sub-cache of the caching system, that the memory address is not cached in the first sub-cache; determining, by second sub-cache of the caching system, that the memory address is not cached in the second sub-cache, wherein the second sub-cache is configured to store, in parallel with the first sub-cache, cache data evicted from the first sub-cache and write-memory commands that are not cached in the first sub-cache; storing first data associated with the first write memory command in a cache line of the second sub-cache; storing the first color tag in the second sub-cache; receiving a second write memory command for the cache line, the write memory command associated with a second color tag; merging the second color tag with the first color tag; storing the merged color tag; and evicting the cache line based on the merged color tag.

Example 49 includes the method of Example 48, wherein the first color tag and the second color tag represent the same color tag.

Example 50 includes the method of Example 48, wherein the first color tag and the second color tag represent different color tags, and wherein the merged color tag comprises a first bit representing the first color tag and a second bit representing the second color tag.

Example 51 includes the method of Example 50, wherein the evicting is based on the first color tag.

Example 52 includes the method of Example 51, wherein the evicting is based on the second color tag.

Example 53 includes the method of Example 48, wherein the first color tag and second color tag are stored in a bit field in a memory tracking a modified, exclusive, shared, and invalid (MESI) state of entries in the second sub-cache data.

Example 54 includes the method of claim Example 53, wherein the bit field includes a bit storing the state for each color tag.

Example 55 includes a device comprising: a processor; a first sub-cache; and a second sub-cache coupled in parallel with the first sub-cache, for storing cache data evicted from the first sub-cache and write-memory commands that are not cached in the first sub-cache, and the second sub-cache including: color tag bits configured to store an indication that a corresponding line of the second sub-cache is associated with a color tag; and an eviction controller configured to evict cache lines of the second sub-cache storing write-memory data based on the color tag associated with the line, and wherein the second sub-cache is further configured to: receive a first write memory command for a memory address, the write memory command associated with a first color tag; store first data associated with the first write memory command in a cache line of the second sub-cache; store the first color tag in the second sub-cache; receive a second write memory command for the cache line, the write memory command associated with a second color tag; merge the second color tag with the first color tag; store the merged color tag; and evict the cache line based on the merged color tag.

Example 56 includes the device of Example 55, wherein the first color tag and the second color tag represent the same color tag.

Example 57 includes the device of Example 55, wherein the first color tag and the second color tag represent different color tags, and wherein the merged color tag comprises a first bit representing the first color tag and a second bit representing the second color tag.

Example 58 includes the device of Example 57, wherein the second sub-cache is further configured to evict the cache line based on the first color tag.

Example 59 includes the device of Example 58, wherein the second sub-cache is further configured to evict the cache line data based on the second color tag.

Example 60 includes the device of Example 55, wherein the first color tag and second color tag are stored in a bit field in a memory tracking modified, exclusive, shared, and invalid (MESI) state of entries in the second sub-cache data.

Example 61 includes a caching system comprising: a first sub-cache; a second sub-cache, coupled in parallel with the first sub-cache, for storing cache data evicted from the first sub-cache and write-memory commands that are not cached in the first sub-cache, the second sub-cache including privilege bits configured to store an indication that a corresponding cache line of the second sub-cache is associated with a level of privilege, and wherein the second sub-cache is further configured to: receive a first write memory command for a memory address, the first write memory command associated with a first level of privilege; store, in a cache line of the second sub-cache, first data associated with the first write memory command; store, in the second sub-cache, the level of privilege associated with the cache line; receive a second write memory command for the cache line, the second write memory command associated with a second level of privilege; merge the first level of privilege with the second level of privilege; store the merged privilege level; and output the merged privilege level with the cache line.

Example 62 includes the caching system of Example 61, wherein privilege level information is stored in a bit field in a memory tracking modified, exclusive, shared, and invalid (MESI) state of entries in the second sub-cache data.

Example 63 includes the caching system of Example 62, wherein the privilege level comprises a two part privilege level.

Example 64 includes the caching system of Example 63, wherein the bit field includes two bits for storing the privilege level.

Example 65 includes the caching system of Example 61, wherein the second sub-cache includes a privilege merge table, the privilege merge table indicating how different levels of privilege are merged.

Example 66 includes the caching system of Example 65, wherein the privilege merge table is predefined.

Example 67 includes the caching system of Example 61, wherein merging the first level of privilege with the second level of privilege comprises selecting the lower privilege level.

Example 68 includes a method for caching data, comprising: receiving, by a caching system, a first write memory command for a memory address, the first write memory command associated with a first privilege level; determining, by a first sub-cache of the caching system, that the memory address is not cached in the first sub-cache; determining, by second sub-cache of the caching system, that the memory address is not cached in the second sub-cache, wherein the second sub-cache is configured to store, in parallel with the first sub-cache, cache data evicted from the first sub-cache and write-memory commands that are not cached in the first sub-cache; storing first data associated with the first write memory command in a cache line of the second sub-cache; storing the first privilege level in the second sub-cache; receiving a second write memory command for the cache line, the second write memory command associated with a second level of privilege; merging the first level of privilege with the second level of privilege; storing the merged privilege level; and outputting the merged privilege level with the cache line.

Example 69 includes the method of Example 67, wherein the privilege level comprises a two part privilege level.

Example 70 includes the method of Example 69, wherein the second sub-cache includes two bits in a bit field for storing the privilege level.

Example 71 includes the method of Example 68, wherein the merging is based on a privilege merge table indicating how different levels of privilege are merged.

Example 72 includes the method of Example 71, wherein the privilege merge table is predefined.

Example 73 includes the method of Example 68, wherein merging the first level of privilege with the second level of privilege comprises selecting the lower privilege level.

Example 74 includes a device comprising: a processor; a first sub-cache; and a second sub-cache coupled in parallel with the first sub-cache, for storing cache data evicted from the first sub-cache and write-memory commands that are not cached in the first sub-cache, the second sub-cache including privilege bits configured to store an indication that a corresponding cache line of the second sub-cache is associated with a level of privilege, and wherein the second sub-cache is further configured to: receive a first write memory command for a memory address, the first write memory command associated with a first level of privilege; store, in a cache line of the second sub-cache, first data associated with the first write memory command; store, in the second sub-cache, the level of privilege associated with the cache line; receive a second write memory command for the cache line, the second write memory command associated with a second level of privilege; merge the first level of privilege with the second level of privilege; store the merged privilege level; and output the merged privilege level with the cache line.

Example 75 includes the device of Example 74, wherein privilege level information is stored in a bit field in a memory tracking modified, exclusive, shared, and invalid (MESI) state of entries in the second sub-cache data.

Example 76 includes the device of Example 75, wherein the privilege level comprises a two part privilege level.

Example 77 includes the device of Example 76, wherein the bit field includes two bits for storing the privilege level.

Example 78 includes the device of Example 75, wherein the second sub-cache includes a privilege merge table, the privilege merge table indicating how different levels of privilege are merged.

Example 79 includes the device of Example 78, wherein the privilege merge table is predefined.

Example 80 includes the device of Example 75, wherein merging the first level of privilege with the second level of privilege comprises selecting the lower privilege level.

Example 81 includes a caching system comprising: a first sub-cache; and a second sub-cache coupled in parallel with the first sub-cache; wherein the second sub-cache includes line type bits configured to store an indication that a corresponding line of the second sub-cache is configured to store write-miss data.

Example 82 includes the caching system of Example 81, wherein the second sub-cache further comprises a tag random access memory (RAM) configured to store a memory address associated with the stored write-miss data.

Example 83 includes the caching system of Example 81, wherein the second sub-cache further comprises a byte enable memory configured to store byte enable logic associated with the stored write-miss data.

Example 84 includes the caching system of Example 83, wherein the byte-enable memory includes memory positions corresponding with each cache line of the second sub-cache.

Example 85 includes the caching system of Example 81, wherein the stored indication indicates whether the corresponding cache line of the second sub-cache is storing write miss entries or cache entries.

Example 86 includes the caching system of Example 81, wherein the line type bits are stored in a memory tracking modified, exclusive, shared, and invalid (MESI) state of entries in the second sub-cache.

Example 87 includes the caching system of Example 81, wherein the first sub-cache is a n-way set associative cache and wherein the second sub-cache is a fully associative cache.

Example 88 includes a method for caching data, comprising: receiving, by a caching system, a write memory request for a memory address; determining, by a first sub-cache of the caching system, that the memory address is not cached in the first sub-cache; determining, by second sub-cache of the caching system, the second sub-cache coupled in parallel with the first sub-cache, that the memory address is not cached in the second sub-cache; storing data associated with the write memory request in the second sub-cache; and storing, in a line type bit of the second sub-cache, an indication that the stored data corresponds to a write-miss.

Example 89 includes the method of Example 88, further comprising storing a memory address associated with the stored write-miss data in a tag random access memory (RAM).

Example 90 includes the method of Example 88, further comprising storing byte enable logic associated with the stored write-miss data in a byte-enable memory.

Example 91 includes the method of Example 88, wherein the line type bits are stored in a memory tracking modified, exclusive, shared, and invalid (MESI) state of entries in the second sub-cache.

Example 92 includes the method of Example 88, further comprising: evicting a cache entry from a line of the second sub-cache, and wherein storing data associated with the write memory request comprises storing the data in the line.

Example 93 includes the method of Example 88, wherein the stored indication indicates whether the corresponding cache line of the second sub-cache is storing write miss entries or cache entries.

Example 94. A device comprising: a processor; a first sub-cache; and a second sub-cache coupled in parallel with the first sub-cache; wherein the second sub-cache includes line type bits configured to store an indication that a corresponding line of the second sub-cache is configured to store write-miss data.

Example 95 includes the device of Example 94, wherein the second sub-cache further comprises a tag random access memory (RAM) configured to store a memory address associated with the stored write-miss data.

Example 96 includes the device of Example 94, wherein the second sub-cache further comprises a byte enable memory configured to store byte enable logic associated with the stored write-miss data.

Example 97 includes the device of Example 96, wherein the byte-enable memory includes memory positions corresponding with each cache line of the second sub-cache.

Example 98 includes the device of Example 94, wherein the stored indication indicates whether the corresponding cache line of the second sub-cache is storing write miss entries or cache entries.

Example 99 includes the device of Example 94, wherein the line type bits are stored in a memory tracking modified, exclusive, shared, and invalid (MESI) state of entries in the second sub-cache.

Example 100 includes the device of claim 94, wherein the first sub-cache is a n-way set associative cache and wherein the second sub-cache is a fully associative cache.

Example 101 includes a caching system comprising: a first sub-cache; and a second sub-cache in parallel with the first sub-cache, wherein the second sub-cache includes: a set of cache lines; line type bits configured to store an indication that a corresponding cache line of the set of cache lines is configured to store write-miss data; and an eviction controller configured to evict a cache line of the second sub-cache storing write-miss data based on an indication that the cache line has been fully written.

Example 102 includes the caching system of Example 101, wherein the eviction controller is further configured to evict a cache line of the second sub-cache storing write-miss data based on an indication that half of the cache line has been written.

Example 103 includes the caching system of Example 102, wherein the eviction controller is configured to determine that no cache line of the second sub-cache storing write-miss data is fully written before evicting the cache line based on the indication that half of the cache line has been written.

Example 104 includes the caching system of Example 102, wherein the second sub-cache further comprises a byte enable memory configured to store byte enable logic associated with the stored write-miss data, and wherein the byte enable memory includes a first bit storing the indication that the cache line has been fully written.

Example 105 includes the caching system of Example 104, wherein the byte enable memory includes a second bit storing the indication that half of the cache line has been written.

Example 106 includes the caching system of Example 105, wherein the first and second bits are determined based on the byte enable logic associated with the stored write-miss data.

Example 107 includes the caching system of Example 106, wherein the first and second bits are determined based on the byte enable logic each time write-miss data is stored in the second sub-cache.

Example 108 includes a method for caching data, comprising: receiving, by a caching system, a write memory request for a memory address; determining, by a first sub-cache of the caching system, that the memory address is not cached in the first sub-cache; determining, by second sub-cache of the caching system, that the memory address is not cached in the second sub-cache; storing data associated with the write memory request in the second sub-cache; storing, in a line type bit of the second sub-cache, an indication that the stored data corresponds to a write-miss; and evicting a cache line of the second sub-cache storing the write-miss based on an indication that the cache line has been fully written.

Example 109 includes the method of Example 108, further comprising evicting a cache line of the second sub-cache storing write-miss data based on an indication that half of the cache line has been written.

Example 110 includes the method of Example 109, further comprising determining that no cache line of the second sub-cache storing write-miss data is fully written before evicting the cache line based on the indication that half of the cache line has been written.

Example 111 includes the method of Example 109, further comprising storing a first bit indicating that the cache line has been fully written in a byte enable memory of the second sub-cache.

Example 112 includes the method of Example 111, further comprising storing a second bit indicating that the cache line is half written in the byte enable memory of the second sub-cache.

Example 113 includes the method of Example 112, wherein the first and second bits are determined based on the byte enable logic associated with the stored write-miss data.

Example 114 includes the method of Example 113, wherein the first and second bits are determined based on the byte enable logic each time write-miss data is stored in the second sub-cache.

Example 115 includes a device comprising: a processor; a first sub-cache; and a second sub-cache in parallel with the first sub-cache; wherein the second sub-cache includes: a set of cache lines; line type bits configured to store an indication that a corresponding cache line of the set of cache lines is configured to store write-miss data, and an eviction controller configured to evict a cache line of the second sub-cache storing write-miss data based on an indication that the cache line has been fully written.

Example 116 includes the device of Example 115, wherein the eviction controller is further configured to evict a cache line of the second sub-cache storing write-miss data based on an indication that half of the cache line has been written.

Example 117 includes the device of Example 116, wherein the eviction controller is configured to determine that no cache line of the second sub-cache storing write-miss data is fully written before evicting the cache line based on the indication that half of the cache line has been written.

Example 118 includes the device of Example 118, wherein the second sub-cache further comprises a byte enable memory configured to store byte enable logic associated with the stored write-miss data, and wherein the byte enable memory includes a first bit storing the indication that the cache line has been fully written.

Example 119 includes the device of Example 118, wherein the byte enable memory includes a second bit storing the indication that half of the cache line has been written.

Example 120 includes the device of Example 119, wherein the first and second bits are determined based on the byte enable logic associated with the stored write-miss data.

Example 121 includes a caching system comprising: a first sub-cache; a second sub-cache, coupled in parallel with the first sub-cache, for storing cache data evicted from the first sub-cache and write-memory commands that are not cached in the first sub-cache; and a cache controller configured to: receive two or more cache commands; determine a conflict exists between the received two or more cache commands; determine a conflict resolution between the received two or more cache commands; and sending the two or more cache commands to the first sub-cache and the second sub-cache.

Example 122 includes the caching system of Example 121, wherein the cache command is a read command and wherein the cache controller is further configured to: determine, based on a memory address of the read command, that the memory address is not cached in the first sub-cache; determine, based on the memory address, that the memory address is stored as a write-memory command in the second sub-cache; and stall the read command until the write-memory command is drained from the second sub-cache.

Example 123 includes the caching system of Example 121, wherein the cache controller is further configured to receive two or more cache commands in parallel.

Example 124 includes the caching system of Example 123, wherein the two or more cache commands include a read command and a write command, and wherein the cache controller is further configured to: determine, based on a first memory address of the read command, a first cache location in the first sub-cache; determine that the first memory address is not cached in the first sub-cache at the first cache location; receive a second cache location in the second sub-cache associated with the read command; determine, based on a second memory address of the write command, that the second memory address is stored as write-memory command in the second sub-cache at the second cache location; receive a third cache location in the second sub-cache associated with the write command; and evict a cached memory item from the first cache location in the first sub-cache to the third cache location in the second sub-cache.

Example 125 includes the caching system of Example 123, wherein the two or more cache commands include a read command and a write command, and wherein the cache controller is further configured to: determine, based on a first memory address of the read command, a first cache location in the first sub-cache; determine that the first memory address is not cached in the first sub-cache at the first cache location; determine, based on a second memory address of the write command, that the second memory address is stored at the first location in the first sub-cache stall the read command; perform the write command; evict the performed write commend to the second sub-cache; and resume the read command after the eviction.

Example 126 includes the caching system of Example 123, wherein the two or more cache commands include a first write command and a second write command, and wherein the cache controller is further configured to: determine that a first memory address of the first write command is not cached in the first sub-cache; determine that a second memory address of the second write command is not cached in the first sub-cache; determine that the first memory address and the second memory address match; merge the first write command and the second write command; and store the merged commands to the second sub-cache.

Example 127 includes the caching system of Example 123, wherein the two or more cache commands include a read command and a write command, and wherein the cache controller is further configured to: determine that a first memory address of the read command is cached in the first sub-cache; determine that a second memory address of the write command is cached in the first sub-cache; determine that the first memory address and the second memory address match; stall the write command until the read command is completed; and resume the write command.

Example 128 includes a method for caching data, comprising: receiving two or more cache commands; determining a conflict exists between the two or more cache commands; determining a conflict resolution between the received two or more cache commands; and sending the two or more cache commands to a first sub-cache and a second sub-cache, wherein the second sub-cache is configured to store, in parallel with the first sub-cache, cache data evicted from the first sub-cache and write-memory commands that are not cached in the first sub-cache.

Example 129 includes the method of claim 8, wherein the cache command is a read command and further comprising: determining, based on a memory address of the read command, that the memory address is not cached in the first sub-cache; determining, based on the memory address, that the memory address is stored as a write-memory command in the second sub-cache; and stalling the read command until the write-memory command is drained from the second sub-cache.

Example 130 includes the method of Example 128, wherein the two or more cache commands are received in parallel.

Example 131 includes the method of Example 130, wherein the two or more cache commands include a read command and a write command, and further comprising: determining, based on a first memory address of the read command, a first cache location in the first sub-cache; determining that the first memory address is not cached in the first sub-cache at the first cache location; receiving a second cache location in the second sub-cache associated with the read command; determining, based on a second memory address of the write command, that the second memory address is stored as write-memory command in the second sub-cache at the second cache location; receiving a third cache location in the second sub-cache associated with the write command; evicting a cached memory item from the first cache location in the first sub-cache to the third cache location in the second sub-cache.

Example 132 includes the method of Example 130, wherein the two or more cache commands include a read command and a write command, and further comprising: determining, based on a first memory address of the read command, a first cache location in the first sub-cache; determining that the first memory address is not cached in the first sub-cache at the first cache location; determining, based on a second memory address of the write command, that the second memory address is stored at the first location in the first sub-cache; stalling the read command; performing the write command; evicting the performed write commend to the second sub-cache; and resuming the read command after the eviction.

Example 133 includes the method of Example 130, wherein the two or more cache commands include a first write command and a second write command, and wherein the cache controller is further configured to: determining that a first memory address of the first write command is not cached in the first sub-cache; determining that a second memory address of the second write command is not cached in the first sub-cache; determining that the first memory address and the second memory address match; merging the first write command and the second write command; and storing the merged commands to the second sub-cache.

Example 134 includes the method of Example 130, wherein the two or more cache commands include a read command and a write command, and further comprising: determining that a first memory address of the read command is cached in the first sub-cache; determining that a second memory address of the write command is cached in the first sub-cache; determining that the first memory address and the second memory address match; stalling the write command until the read command is completed; and resuming the write command.

Example 135 includes a device comprising: a processor; a first sub-cache; and a second sub-cache coupled in parallel with the first sub-cache, for storing cache data evicted from the first sub-cache and write-memory commands that are not cached in the first sub-cache; and a cache controller configured to: receive two or more cache commands; determine a conflict exists between the received two or more cache commands; determine a conflict resolution between the received two or more cache commands; and sending the two or more cache commands to the first sub-cache and the second sub-cache.

Example 136 includes the device of Example 135, wherein the cache command is a read command and wherein the cache controller is further configured to: determine, based on a memory address of the read command, that the memory address is not cached in the first sub-cache; determine, based on the memory address, that the memory address is stored as a write-memory command in the second sub-cache; and stall the read command until the write-memory command is drained from the second sub-cache.

Example 137 includes the device of Example 135, wherein the cache controller is further configured to receive two or more cache commands in parallel.

Example 138 includes the device of Example 137, wherein the two or more cache commands include a read command and a write command, and wherein the cache controller is further configured to: determine, based on a first memory address of the read command, a first cache location in the first sub-cache; determine that the first memory address is not cached in the first sub-cache at the first cache location; receive a second cache location in the second sub-cache associated with the read command; determine, based on a second memory address of the write command, that the second memory address is stored as write-memory command in the second sub-cache at the second cache location; receive a third cache location in the second sub-cache associated with the write command; and evict a cached memory item from the first cache location in the first sub-cache to the third cache location in the second sub-cache.

Example 139 includes the device of Example 137, wherein the two or more cache commands include a read command and a write command, and wherein the cache controller is further configured to: determine, based on a first memory address of the read command, a first cache location in the first sub-cache; determine that the first memory address is not cached in the first sub-cache at the first cache location; determine, based on a second memory address of the write command, that the second memory address is stored at the first location in the first sub-cache; stall the read command; perform the write command; evict the performed write commend to the second sub-cache; and resume the read command after the eviction.

Example 140 includes the device of Example 137, wherein the two or more cache commands include a first write command and a second write command, and wherein the cache controller is further configured to: determine that a first memory address of the first write command is not cached in the first sub-cache; determine that a second memory address of the second write command is not cached in the first sub-cache; determine that the first memory address and the second memory address match; merge the first write command and the second write command; and store the merged commands to the second sub-cache.

The term "couple" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

Modifications are possible in the described embodiments, and other embodiments are possible, within the scope of the claims.

What is claimed is:

1. A device comprising:
a processor configured to perform a first set of instructions associated with a first privilege level and a second set of instructions associated with a second privilege level;
a cache controller coupled to the processor;
a cache memory coupled to the cache controller and that includes a cache line; and
a second memory coupled to the cache controller, wherein the cache controller is configured to:
receive a write command associated with writing a first set of data to the cache line, wherein the first set of data is associated with the first privilege level; and
based on the write command:
determine whether the cache line currently stores a second set of data associated with the second privilege level; and
when the cache line stores the second set of data:
merge the first set of data with the second set of data to produce a merged set of data;
store the merged set of data in the cache line;
determine a merged indicator that specifies a third privilege level associated with the merged set of data; and
store the merged indicator in the second memory.

2. The device of claim 1, wherein the second memory is configured to store state data associated with the cache line.

3. The device of claim 2, wherein the state data specifies whether a value stored in the cache line is modified, exclusive, shared, or invalid.

4. The device of claim 1 further comprising a third memory coupled to the cache controller and configured to store a table, wherein the cache controller is configured to determine the merged indicator based on the table.

5. The device of claim 4, wherein the table is configurable.

6. The device of claim 1, wherein each of the first privilege level and the second privilege level includes two parts.

7. The device of claim 6, wherein each of the first privilege level and the second privilege level includes a first part that specifies either a guest privilege or a root privilege.

8. The device of claim 7, wherein each of the first privilege level and the second privilege level includes a second part that specifies either a user privilege or a supervisor privilege.

9. The device of claim 1, wherein the third privilege level is a lower of the first privilege level and the second privilege level.

10. The device of claim 1, wherein the cache memory is a victim cache memory, and the second memory is a victim cache tag memory.

11. The device of claim 10, further comprising a main cache memory coupled to the cache controller, wherein the victim cache memory is configured to store data evicted from the main cache memory.

12. The device of claim 1, wherein the cache controller is a level one (L1) cache controller, and the cache memory is an L1 cache memory.

13. A device comprising:
a processor configured to perform a first process associated with a first privilege level and a second process associated with a second privilege level;
a cache controller coupled to the processor;
a main cache memory;
a victim cache memory coupled to the cache controller and that includes a cache line; and
a third memory coupled to the cache controller, wherein the cache controller is configured to:
receive, from the processor, a write command associated with writing a first set of data at an address, wherein the first set of data is associated with the first process; and
based on the write command:
determine whether data associated with the address is stored in the main cache memory or stored in the victim cache memory in parallel; and
determine, based on whether the cache line of the victim cache memory currently stores a second set of data associated with the second process, whether to:
merge the first set of data with the second set of data to produce a merged set of data;
store the merged set of data in the cache line;
determine a merged indicator that specifies a third privilege level associated with the merged set of data; and
store the merged indicator in the third memory.

14. The device of claim 13, wherein the third memory is configured to store state data associated with the cache line.

15. The device of claim 14, wherein the state data specifies whether a value stored in the cache line is modified, exclusive, shared, or invalid.

16. The device of claim 13 further comprising a fourth memory coupled to the cache controller and configured to store a table, wherein the cache controller is configured to determine the merged indicator based on the table.

17. A method comprising:
receiving a write command associated with writing a first set of data to a cache line of a cache memory, wherein the first set of data is associated with a first privilege level;
determining whether a second set of data is stored in the cache line, wherein the second set of data is associated with a second privilege level; and
determining, based on whether the second set of data is stored in the cache line, whether to:
merge the first set of data with the second set of data to produce a merged set of data;
store the merged set of data in the cache line;
determine a merged indicator that specifies a third privilege level associated with the merged set of data; and
store the merged indicator in a second memory.

18. The method of claim 17, wherein the second memory is configured to store state data associated with the cache line.

19. The method of claim 18, wherein the state data specifies whether a value stored in the cache line is modified, exclusive, shared, or invalid.

20. The method of claim 17, wherein the determining of the merged indicator includes querying a table based on the first privilege level and the second privilege level.

* * * * *